(12) United States Patent
Matsuno et al.

(10) Patent No.: US 10,312,877 B2
(45) Date of Patent: Jun. 4, 2019

(54) VARIABLE GAIN AMPLIFIER, CORRECTION METHOD AND RECEIVING DEVICE

(71) Applicant: Renesas Electronics Corporation, Tokyo (JP)

(72) Inventors: Noriaki Matsuno, Tokyo (JP); Satoru Tomisawa, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/672,637

(22) Filed: Aug. 9, 2017

(65) Prior Publication Data

US 2018/0091107 A1    Mar. 29, 2018

(30) Foreign Application Priority Data

Sep. 23, 2016  (JP) ................. 2016-185795

(51) Int. Cl.
| | |
|---|---|
| *H03F 1/02* | (2006.01) |
| *H03G 3/30* | (2006.01) |
| *H04B 1/62* | (2006.01) |
| *H03F 3/45* | (2006.01) |
| *H03G 1/00* | (2006.01) |

(Continued)

(52) U.S. Cl.
CPC ....... *H03G 3/3063* (2013.01); *H03F 3/45179* (2013.01); *H03F 3/45475* (2013.01); *H03F 3/45748* (2013.01); *H03F 3/45973* (2013.01); *H03G 1/0088* (2013.01); *H03M 1/183* (2013.01); *H04B 1/62* (2013.01); *H03F 3/45076* (2013.01); *H03F 2203/45051* (2013.01); *H03F 2203/45138* (2013.01); *H03F 2203/45528* (2013.01); *H03F 2203/45588* (2013.01); *H03F 2203/45591* (2013.01); *H03M 1/0612* (2013.01)

(58) Field of Classification Search
CPC ..................................... H03F 1/02; H03F 3/45
USPC ......................................................... 330/2, 9
See application file for complete search history.

(56) References Cited

U.S. PATENT DOCUMENTS

| | | | | |
|---|---|---|---|---|
| 4,855,685 | A | * | 8/1989 | Hochschild .......... H03G 1/0088 330/282 |
| 8,463,225 | B2 | | 6/2013 | Igarashi et al. |
| 2006/0284671 | A1 | * | 12/2006 | Ohba ................... H03F 3/45183 330/9 |

FOREIGN PATENT DOCUMENTS

| | | |
|---|---|---|
| JP | 2012-099873 A | 5/2012 |
| JP | 2012-156936 A | 8/2012 |

* cited by examiner

*Primary Examiner* — Steven J Mottola
(74) *Attorney, Agent, or Firm* — McDermott Will & Emery LLP

(57) ABSTRACT

To provide a variable gain amplifier capable of correcting a DC offset voltage through simpler control even when a gain thereof is changed. A differential output type variable gain amplifier is equipped with a first voltage correction unit coupled to a preceding stage of a variable gain amplifier circuit and for outputting a first correction voltage to correct a potential difference generated between a first conductor provided with a first input resistor and a second conductor provided with a second input resistor, and a second voltage correction unit coupled to a subsequent stage of the variable gain amplifier circuit and for correcting a differential output. A control unit is configured to control the first correction voltage and a correction amount of a potential difference by the second voltage correction unit and thereby attenuate a DC offset voltage included in the differential output.

9 Claims, 13 Drawing Sheets

(51) Int. Cl.
*H03M 1/18* (2006.01)
*H03M 1/06* (2006.01)

VARIABLE GAIN AMPLIFIER, CORRECTION METHOD AND RECEIVING DEVICE

CROSS-REFERENCE TO RELATED APPLICATIONS

The disclosure of Japanese Patent Application No. 2016-185795 filed on Sep. 23, 2016 including the specification, drawings and abstract is incorporated herein by reference in its entirety.

BACKGROUND

The present disclosure relates to a variable gain amplifier, and more particularly to a technology of correcting a DC offset voltage generated by a variable gain amplifier.

A variable gain amplifier capable of gain control has generally been used in a wireless receiving device. It has been known that a DC (Direct Current) offset voltage causing characteristic deterioration occurs in the variable gain amplifier. This DC offset voltage mainly may occur due to a mismatch of the size or the like of a transistor differential pair in an op amplifier.

A semiconductor integrated circuit related to a technology of correcting (attenuating) the DC offset voltage and disclosed in Japanese Unexamined Patent Application Publication Laid-Open No. 2012-156936 (Patent Document 1) adopts a configuration in which an analog current is applied from a digital-analog converter DAC0 to a caribration resistor R22 and a DC offset voltage in a FILTER 300 is reduced by its voltage drop.

Further, Japanese Unexamined Patent Application Publication Laid-Open No. 2012-099873 (Patent Document 2) has disclosed a configuration in which a DC offset cancel circuit 51 is provided at an output stage of a differential amplifier 5 to reduce an output DC offset voltage. More specifically, the DC offset cancel circuit 51 separates a DC component from a differential output signal of an Amp2 by use of a filter 511 and applies a correction current corresponding to the DC component to an Amp1.

RELATED ART DOCUMENTS

Patent Documents

[Patent Document 1] Japanese Unexamined Patent Application Publication Laid-Open No. 2012-156936
[Patent Document 2] Japanese Unexamined Patent Application Publication Laid-Open No. 2012-099873

SUMMARY

Since, however, the semiconductor integrated circuit disclosed in Patent Document 1 detects a DC offset voltage included in a differential output signal of an amplifier as a digital signal and corrects the DC offset voltage by a logic unit, based on the detected signal, it takes time to correct the DC offset voltage. Therefore, the semiconductor integrated circuit is adapted to adopt a configuration in which the DC offset voltage is corrected at power-on or in an initialization sequence such as immediately before a call start. When the gain of a variable gain amplifier is changed during operation, it is difficult to perform the correction of a DC offset corresponding to the change.

On the other hand, since a semiconductor integrated circuit disclosed in Patent Document 2 is capable of detecting a DC offset component from a differential output signal of a variable gain amplifier as an analog signal, applying a correction current corresponding to the DC offset component to the amplifier, and performing correction work simultaneously while performing a desired analog operation, a DC offset voltage can be corrected even when the gain is changed. The semiconductor integrated circuit has a problem in that since the DC offset cancel circuit is always driven to correct the DC offset voltage, current consumption increases. Also, the semiconductor integrated circuit has a problem in that since the semiconductor integrated circuit is required to mount a large on-chip capacitor for detecting the DC offset component from the differential output signal during its operation, the current and area thereof increase. This problem becomes remarkable as the amplifier takes a multistage configuration. Further, the semiconductor integrated circuit is required to change a correction current according to the gain and needs a certain period of time for correction. Therefore, a receiving device equipped with the semiconductor integrated circuit may not be able to sufficiently correct the DC offset voltage when a gain setting (AGC: Automatic Gain Control) period is short.

The present disclosure has been made to solve the above-described problems. An object in one aspect is to provide a variable gain amplifier capable of correcting a DC offset voltage through simpler control even when a gain thereof is changed, and a receiving device equipped with the variable gain amplifier. An object in another aspect is to provide a method capable of correcting a DC offset voltage even when a gain is changed.

Other objects and novel features of the present disclosure will become apparent from the description of the present specification and the accompanying drawings.

A variable gain amplifier according to one aspect is equipped with a differential amplifier circuit including an inversion input terminal, a non-inversion input terminal, an inversion output terminal, and a non-inversion output terminal; first and second feedback resistors respectively coupled between the inversion output terminal and the non-inversion input terminal and between the non-inversion output terminal and the inversion input terminal; first and second input resistors respectively coupled to the inversion input terminal and the non-inversion input terminal; a control unit for controlling resistance values of the first and second feedback resistors or resistance values of the first and second input resistors to control a gain; a first voltage correction unit coupled to a preceding stage of the first and second input resistors and for outputting a first correction voltage to correct a potential difference generated between a first conductor provided with the first input resistor and a second conductor provided with the second input resistor; and a second voltage correction unit coupled to the inversion output terminal and the non-inversion output terminal and for correcting a potential difference generated between a third conductor coupled to the inversion output terminal and a fourth conductor coupled to the non-inversion output terminal. The control unit is configured to control the first correction voltage and a correction amount of the potential difference by the second voltage correction unit to attenuate a DC offset voltage generated between the inversion output terminal and the non-inversion output terminal.

The variable gain amplifier according to the one aspect is capable of correcting a DC offset voltage in simpler control than heretofore even when a gain is changed.

The above, other objects, features, aspects and advantages of the present invention will become apparent from the following detailed description related to the present invention understood in conjunction with the accompanying drawings.

DETAILED DESCRIPTION

Figure 1:
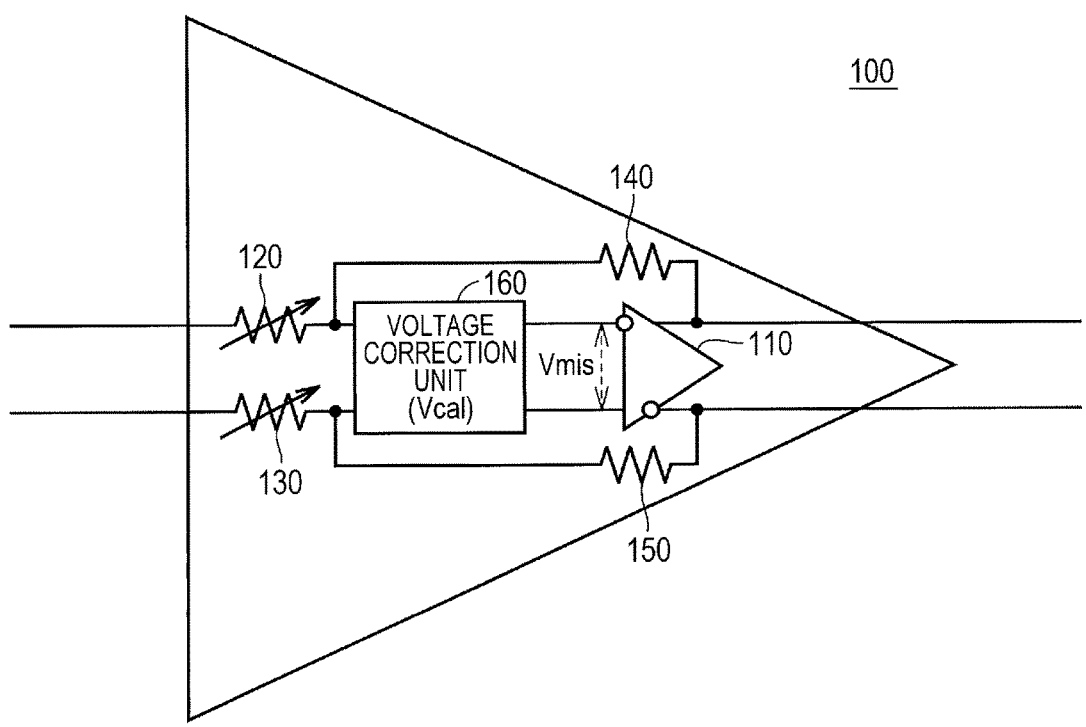
FIG. 1 is a diagram describing a variable gain amplifier 100 according to a related art.

Preferred embodiments of the present invention will hereinafter be described in detail with reference to the accompanying drawings. In the following description, the same reference numerals are respectively attached to the same components. Their designations and functions are also the same. Accordingly, their detailed description will not be repeated.

[Related Art]

FIG. 1 is a diagram describing a variable gain amplifier 100 according to a related art. Referring to FIG. 1, the variable gain amplifier 100 is equipped with a differential amplifier circuit 110, input resistors 120 and 130, feedback resistors 140 and 150, and a voltage correction unit 160.

The input resistors 120 and 130 are arranged in a preceding stage of the differential amplifier circuit 110. The feedback resistors 140 and 150 are respectively arranged between a non-inversion output terminal and an inversion input terminal of the differential amplifier circuit 110 and between an inversion output terminal and a non-inversion input terminal thereof. The voltage correction unit 160 is arranged between the input resistors 120 and 130 and the differential amplifier circuit 110.

The resistance values of the input resistor 120 and the input resistor 130 are the same and are assumed to be R1. The resistance values of the feedback resistor 140 and the feedback resistor 150 are also the same and are assumed to be R2. In this case, the gain of the variable gain amplifier 100 becomes R2/R1.

A voltage obtained by converting a DC offset voltage included in a differential output signal outputted from the differential amplifier circuit 110 into an input voltage of the differential amplifier circuit 110 is defined to be Vmis. At this time, a correction voltage Vcal outputted from the voltage correction unit 160 becomes a −Vmis to cancel this Vmis. A relational expression of Vcal=−Vmis does not depend on the gain R2/R1 of the variable gain amplifier 100. Therefore, if the voltage correction unit 160 is ideally operated, it can correct the DC offset voltage even if the gain is changed.

However, the voltage correction unit 160 must always apply a correction voltage of −Vmis while following a change in the input voltage determined by the differential amplifier circuit 110 and a feedback circuit. It is therefore difficult to realize such a voltage correction unit 160 as to be able to always accurately correct the DC offset voltage. A description will thus be made about a variable gain amplifier according to one embodiment, which will solve such a problem.

[Embodiment 1]

(Configuration of Variable Gain Amplifier)

Figure 2:
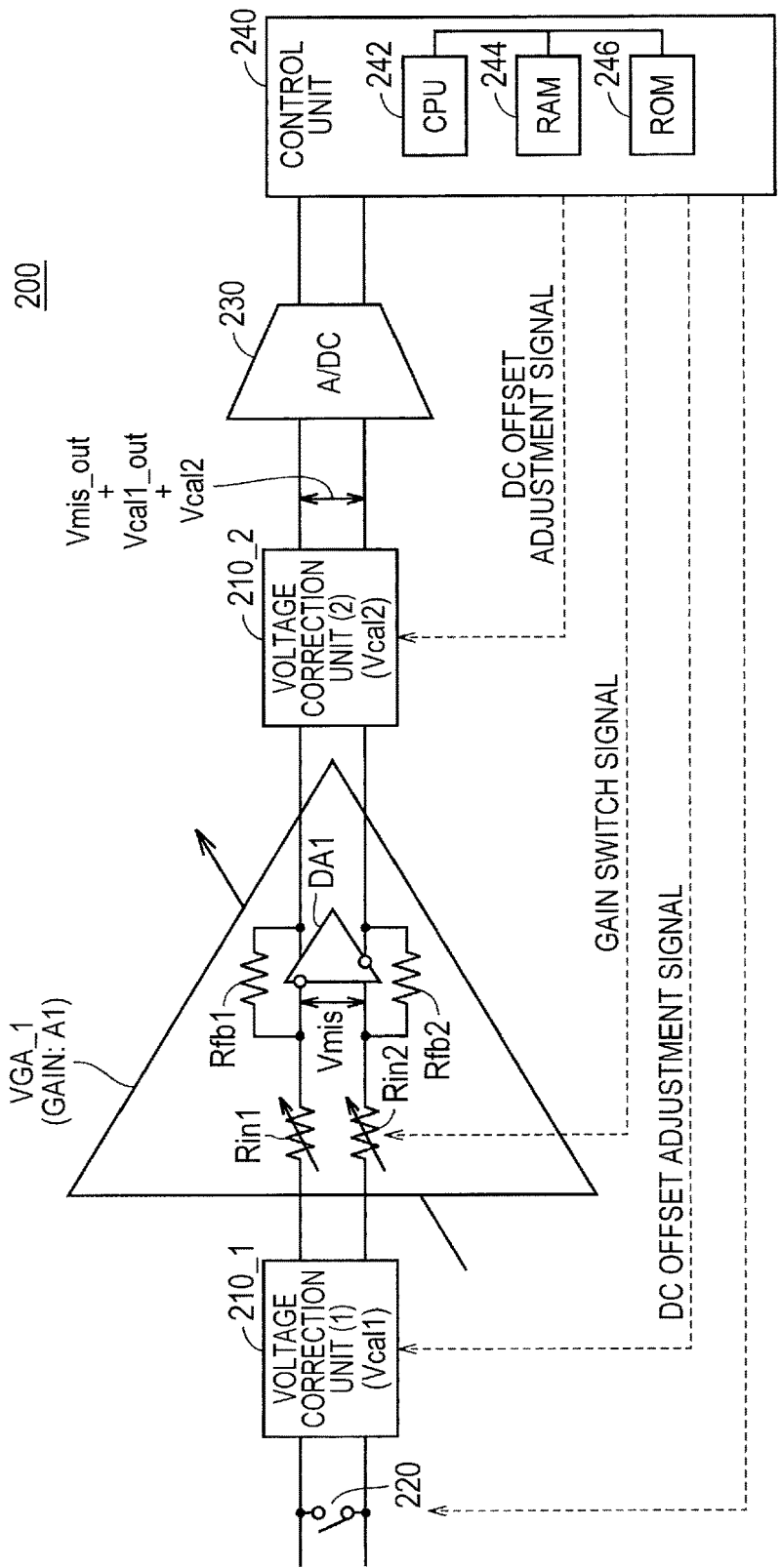
FIG. 2 is a diagram describing a configuration example of a variable gain amplifier 200 according to one embodiment.

FIG. 2 is a diagram describing a configuration example of a variable gain amplifier 200 according to one embodiment. Referring to FIG. 2, the variable gain amplifier 200 is equipped with a variable gain amplifier circuit VGA_1, a voltage correction unit 210_1, a voltage correction unit 210_2, a switch 220, an analog digital converter (hereinafter also called "A/DC") 230, and a control unit 240.

The variable gain amplifier circuit VGA_1 includes a differential amplifier circuit DA1, input resistors Rin1 and Rin2, and feedback resistors Rfb1 and Rfb2. The feedback resistor Rfb1 is coupled between a non-inversion output terminal and an inversion input terminal of the differential amplifier circuit DA1. The feedback resistor Rfb2 is coupled between an inversion output terminal and a non-inversion input terminal of the differential amplifier circuit DA1. The resistance value of the feedback resistor Rfb1 and the resistance value of the feedback resistor Rfb2 are the same. The resistance value of each feedback resistor is assumed to be R2. The input resistor Rin1 is coupled to the inversion input terminal of the differential amplifier circuit DA1. The input resistor Rin2 is coupled to the non-inversion input terminal of the differential amplifier circuit DA1. The resistance value of the input resistor Rin1 and the resistance value of the input resistor Rin2 are the same. The resistance value of each input resistor is assumed to be R1. At this time, the gain of the variable gain amplifier circuit VGA_1 is R2/R1.

The voltage correction unit 210_1 is coupled to a stage prior to the input resistors Rin1 and Rin2. The voltage correction unit 210_1 is configured to correct an input differential signal of the differential amplifier circuit DA1. More specifically, in order to correct a potential difference generated between a conductor provided with the input resistor Rin1 and a conductor provided with the input resistor Rin2, the voltage correction unit 210_1 outputs a correction voltage Vcal1 to either of these conductors.

The voltage correction unit 210_2 is coupled to the non-inversion output terminal and inversion output terminal of the differential amplifier circuit DA1. The voltage correction unit 210_2 is configured to correct an output differential signal of the differential amplifier circuit DA1. More specifically, in order to correct a potential difference generated between a conductor coupled to the inversion output terminal of the differential amplifier circuit DA1 and a conductor coupled to the non-inversion output terminal thereof, the voltage correction unit 210_2 outputs a correction voltage Vcal2 to either of these conductors. A specific configuration of the voltage correction units 210_1 and 210_2 will be described later.

The switch 220 is arranged in a preceding stage of the voltage correction unit 210_1 and configured to make it possible to short-circuit the two conductors inputted to the voltage correction unit 210_1. As an example, the switch 220 can be realized by a MOSFET (Metal-Oxide-Semiconductor Field-Effect Transistor).

The A/DC 230 converts a differential signal (analog signal) outputted from the voltage correction unit 210_2 into a digital signal and outputs the same to the control unit 240.

The control unit 240 includes a CPU (Central Processing Unit) 242, a RAM (Random Access Memory) 244, and a ROM (Read Only Memory) 246. The CPU 242 digitally processes the digital signal inputted from the A/DC 230 in accordance with a control program stored in the ROM 246. The RAM 244 is typically a DRAM (Dynamic Random Access Memory) or the like and functions as a working memory which temporarily stores data or the like necessary for the CPU 242 execute the control program. The ROM 246 is typically a flash memory or the like and stores therein the control program executable by the CPU 242.

Incidentally, in another aspect, the control unit 240 can be realized by a semiconductor integrated circuit like at least one processor, at least one integrated circuit for specific application ASIC (Application Specific Integrated Circuit), at least one DSP (Digital Signal Processor), at least one FPGA (Field Programmable Gate Array), and/or a circuit having another arithmetic function.

The control unit 240 is electrically coupled to the voltage correction unit 210_1, the voltage correction unit 210_2, the variable gain amplifier circuit VGA_1, and the switch 220 respectively.

The control unit 240 outputs a DC offset adjustment signal to the voltage correction unit 210_1 and the voltage correction unit 210_2. The voltage correction units 210_1 and 210_2 respectively output correction voltages Vcal1 and Vcal2 corresponding to the input DC offset adjustment signal.

The control unit 240 outputs a gain switch signal to the variable gain amplifier circuit VGA_1. The variable gain amplifier circuit VGA_1 changes the resistance values (R1) of the input resistors Rin1 and Rin2 respectively according to the input gain switch signal. Incidentally, in another aspect, the variable gain amplifier circuit VGA_1 may be configured to change the resistance values (R2) of the feedback resistors Rfb1 and Rfb2 respectively.

The control unit 240 outputs an opening/closing signal to the switch 220. The switch 220 short-circuits the conductor coupled thereto according to the opening/closing signal inputted thereto.

(Technical Idea for Correcting DC Offset Voltage)

A description will next be made about a method of correcting a DC offset voltage in the variable gain amplifier 200. A DC offset voltage included in a differential output signal outputted from the differential amplifier circuit DA1 is defined to be Vmis_out. Further, a voltage (hereinafter also called "mismatch voltage") obtained by converting the DC offset voltage into an input voltage of the differential amplifier circuit DA1 is defined to be Vmis. At this time, the relation between Vmis and Vmis_out is represented by the following equation (1):

$$\text{Vmis\_out} = Vmis + Vmis \frac{R2}{R1} \quad (1)$$

Further, an offset voltage Vcal1_out obtained by amplifying a correction voltage Vcal1 outputted from the voltage correction unit 210_1 by the variable gain amplifier circuit VGA_1 is represented by the following equation (2):

$$\text{Vcal1\_out} = Vcal1 \frac{R2}{R1} \quad (2)$$

An offset voltage generated in a subsequent stage of the voltage correction unit 210_2 becomes a value obtained by adding together Vmis_out, Vcal1_out and Vcal2. As this value goes close to zero, the offset voltage included in the differential output signal of the variable gain amplifier circuit VGA_1 is corrected (attenuated).

Referring to the equation (1), the component (Vmis) which does not depend on the gain (R2/R1) and the component (Vmis×R2/R1) which depends on the gain are included in the DC offset voltage Vmis_out. Further, referring to the equation (2), the offset voltage Vcal1_out depends on the gain. Therefore, if the offset voltage Vcal1_out and the component which depends on the gain of the DC offset voltage Vmis_out are cancelled with each other, the DC offset voltage Vmis_out remains unchanged even if the gain is changed. If the component which does not depend on the gain of the DC offset voltage Vmis_out and the correction voltage Vcal2 of the voltage correction unit 210_2 are cancelled with each other under this condition, the DC offset voltage Vmis_out is always corrected even if the gain of the variable gain amplifier circuit VGA_1 is changed.

The control unit 240 outputs a DC offset adjustment signal for cancelling the component which depends on the gain of the DC offset voltage Vmis_out to the voltage correction unit 210_1. Further, the control unit 240 outputs a DC offset adjustment signal for cancelling the component which does not depend on the gain of the DC offset voltage Vmis_out to the voltage correction unit 210_2.

According to the above, when the amounts of voltage correction of the voltage correction units 210_1 and 210_2 are set, the variable gain amplifier 200 according to the one embodiment is capable of always correcting (attenuating) the DC offset voltage included in the differential output signal of the variable gain amplifier circuit VGA_1 even when the gain of the variable gain amplifier circuit VGA_1 is changed. Further, even in the case where the gain is changed, the control unit 240 does not require such special control as to change the voltage correction amounts of the voltage correction units 210_1 and 210_2. Therefore, the variable gain amplifier 200 does not require a mechanism of detecting the DC offset voltage included in the differential output signal during its operation and always correcting the DC offset. Consequently, the variable gain amplifier 200 is capable of realizing miniaturization and a reduction in power consumption more than heretofore.

(Configuration of Voltage Correction Unit 210)

A configuration example and a control example of the voltage correction units 210_1 and 210_2 (hereinafter also collectively called "voltage correction unit 210") will next be described.

Figure 3:
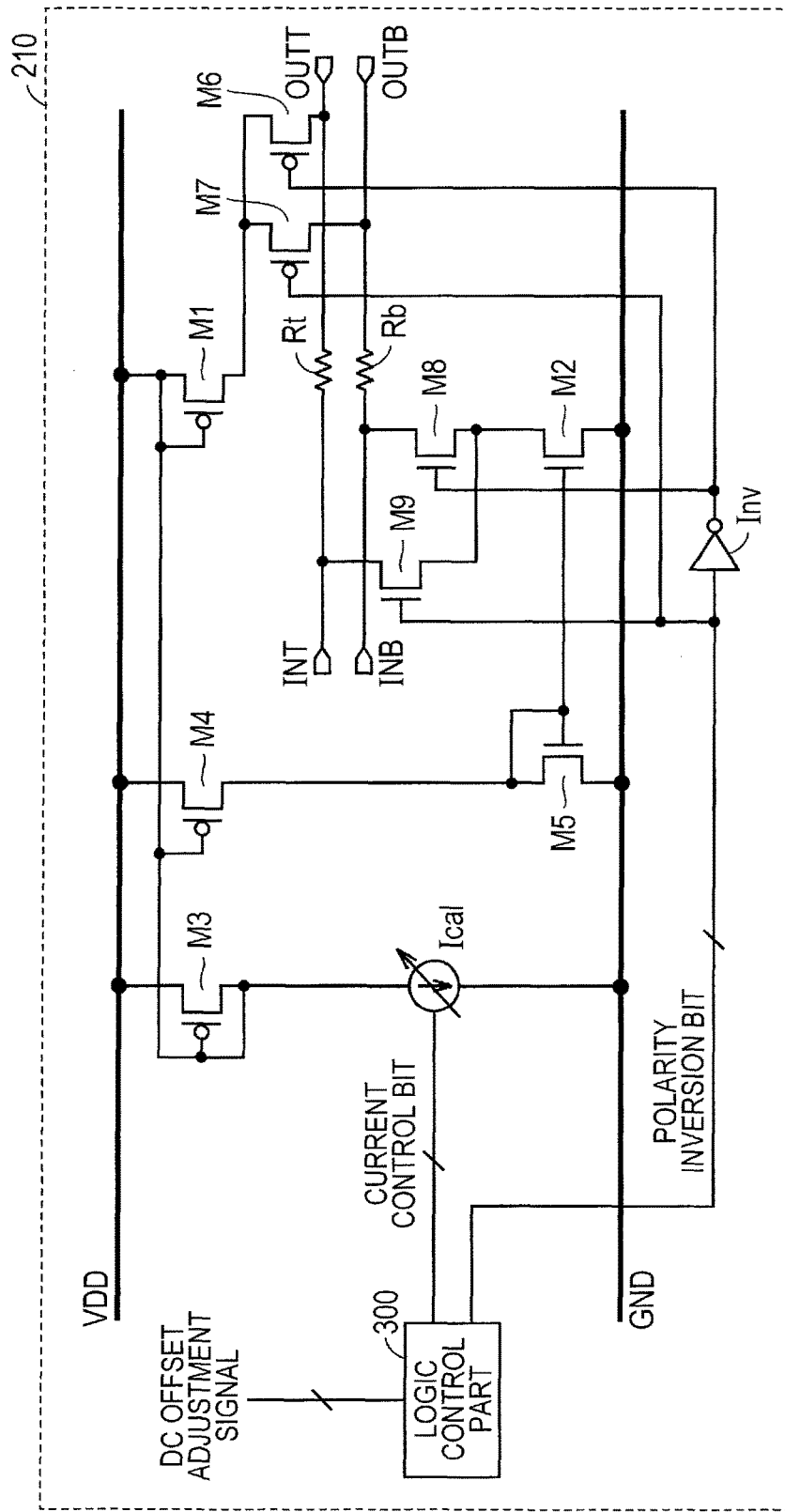
FIG. 3 is a diagram describing a configuration example of a voltage correction unit 210 according to one embodiment.

FIG. 3 is a diagram describing a configuration example of the voltage correction unit 210 according to the one embodiment. In the one embodiment, the voltage correction units 210_1 and 210_2 are the same in configuration. The voltage correction unit 210_1 will be described here by way of example.

Referring to FIG. 3, the voltage correction unit 210_1 includes terminals INT and INB which receive outputs from the conductors coupled to the switch 220, and terminals OUTT and OUTB for outputting a differential input signal to the variable gain amplifier circuit VGA_1. A resistor Rt is provided between the input terminal INT and the output terminal OUTT. A resistor Rb is provided between the input terminal INB and the output terminal OUTB.

The voltage correction unit 210_1 further includes a logic control part 300, a variable current source Ical, pMOS transistors M1, M3, M4, M6, and M7, nMOS transistors M2, M5, M8, and M9, and an inverter Inv.

The pMOS transistor M3 has a drain and a gate coupled to each other by diode coupling. The gate of the pMOS transistor M3 is coupled to gates of the pMOS transistors M1 and M4. Thus, a current mirror circuit is formed by the pMOS transistors M1, M3, and M4.

Further, the nMOS transistor M5 has a drain and a gate coupled to each other by diode coupling. The gate of the nMOS transistor M5 is coupled to a gate of the nMOS transistor M2. Thus, a current mirror circuit is formed by the nMOS transistors M5 and M2.

In the one embodiment, the sizes (gate widths) of the pMOS transistors M1, M3, and M4 can be set equal to each other, and the sizes of the nMOS transistors M2 and M5 can be set equal to each other. In this case, the amounts of current flowing in the pMOS transistor M1 and the nMOS transistor M2 become equal to each other by a current mirror effect. Consequently, the voltage correction unit 210_1 does not affect the operation of the analog circuit arranged in its own preceding or subsequent stage.

When the amount of current flowing in the pMOS transistor M1 is larger than the amount of current flowing in the nMOS transistor M2, a differential current therebetween flows from the voltage correction unit 210_1 to the outside. As a result, the voltage correction unit 210_1 may affect the operation of the variable gain amplifier circuit VGA_1. Further, when the amount of current flowing in the pMOS transistor M1 is smaller than the amount of current flowing in the nMOS transistor M2, a differential current therebetween flows from the outside to the voltage correction unit 210_1. As a result, the voltage correction unit 210_1 may affect the operation of the variable gain amplifier circuit VGA_1. As described above, the voltage correction unit 210_1 sets the amounts of current flowing in the pMOS transistor M1 and the nMOS transistor M2 to be equal (sets a mirror ratio of each current mirror circuit to 1), thereby making it possible to solve these problems.

The logic control part 300 receives the input of the DC offset adjustment signal outputted from the control unit 240. The logic control part 300 outputs a current control bit and a polarity inversion bit according to the present DC offset adjustment signal.

In the one embodiment, the variable current source Ical may contain a plurality of current sources. The variable current source Ical controls the number of the current sources to be operated, according to the input current control bit to make it possible to adjust the current amount.

The current outputted from the variable current source Ical is copied by the respective current mirror circuits, after which they flow into the pMOS transistor M1 and the nMOS transistor M2. These currents flow into the pMOS transistor M6 and the nMOS transistor M9 when the polarity inversion bit is High. Thus, the current flows through the resistor Rt. On the other hand, when the polarity inversion bit is Low, the currents flow into the pMOS transistor M7 and the nMOS transistor M8. Thus, the current flows through the resistor Rb. The voltage correction unit 210_1 makes the current to flow to the resistor Rt or Rb to cause a voltage drop, thereby generating a correction voltage Vcal1.

Incidentally, the current outputted from the variable current source Ical flows through the resistor Rt or Rb and flows to GND through the nMOS transistor M2.

The control unit 240 controls the current control bit and polarity inversion bit outputted from the logic control part 300 using the DC offset adjustment signal. The control unit 240 controls the polarity inversion bit to thereby make the current to flow into either one of the resistors Rt and Rb to switch the polarity of the correction voltage Vcal. Further, the control unit 240 controls the current control bit to thereby control the magnitude of the correction voltage Vcal1.

(Flow for Correcting DC Offset Voltage)

A description will next be made about how the variable gain amplifier 200 corrects the DC offset voltage included in the differential output signal of the variable gain amplifier circuit VGA_1, using FIG. 4.

Figure 4:
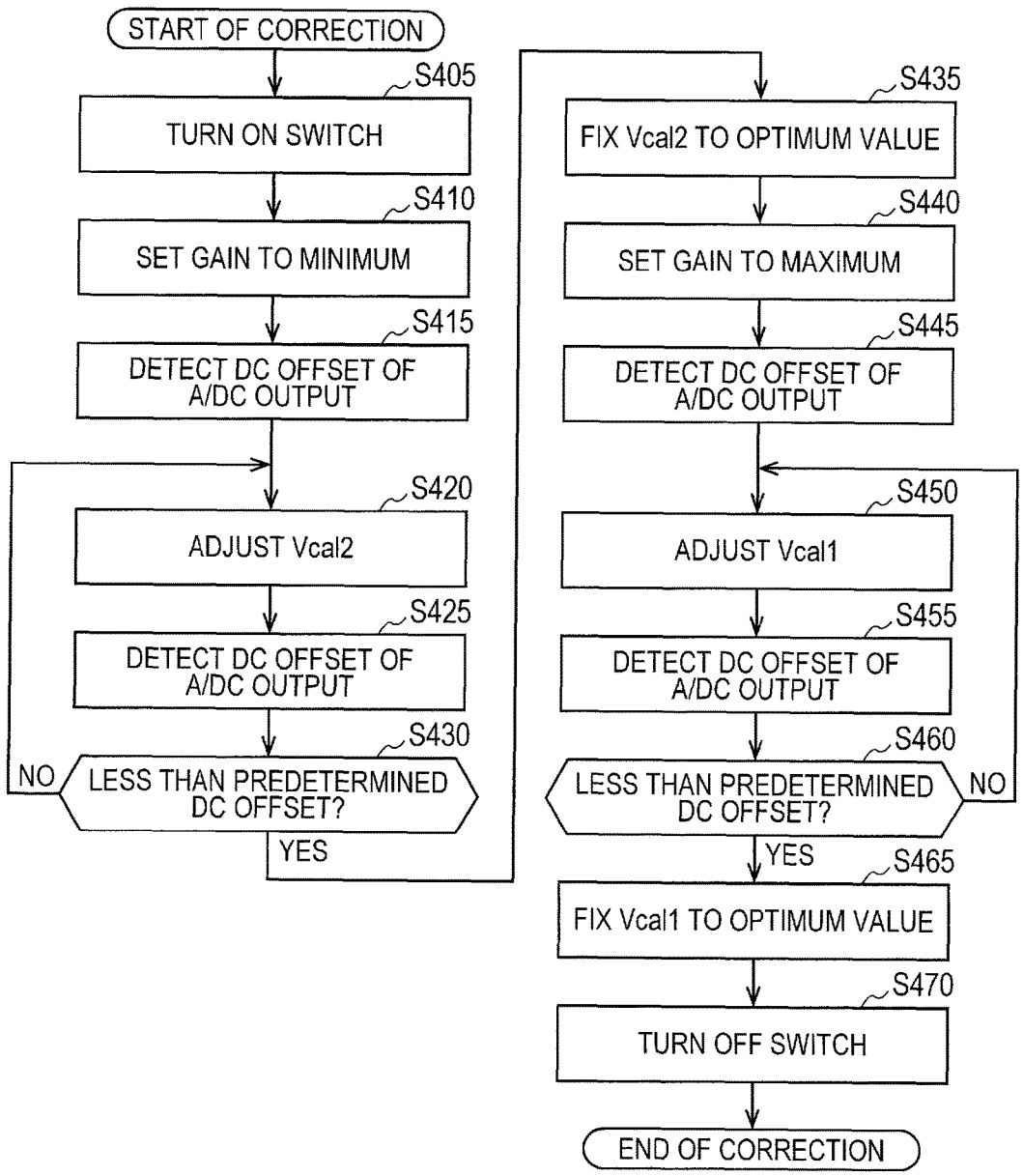
FIG. 4 is a flowchart describing a method of correcting a DC offset voltage according to one embodiment.

FIG. 4 is a flowchart describing a method of correcting the DC offset voltage according to the one embodiment. Processing shown in FIG. 4 is realized by executing the control program stored in the ROM 246 by the CPU 242. In another aspect, a part or all of the processing may be executed by a circuit element or another hardware. The processing shown in FIG. 4 can be executed at power-on of the variable gain amplifier 200 or in an initialization sequence for its operation start. In one aspect, the correction voltage Vcal1 of the voltage correction unit 210_1 and the correction voltage Vcal2 of the voltage correction unit 210_2 can respectively be set to 0 at the start time of the processing shown in FIG. 4.

In Step S405, the CPU 242 transmits an opening/closing signal to the switch 220 to bring the switch 220 to an ON state. Consequently, the DC offset voltage of the variable gain amplifier circuit VGA_1 can be corrected without being affected by the DC offset voltage of the preceding stage of the voltage correction unit 210_1.

In Step S410, the CPU 242 outputs a gain switch signal to set the gain of the variable gain amplifier circuit VGA_1 to the minimum value. Thus, the component (Vmis) which does not depend on the gain becomes sufficiently larger than the component (Vmis×R2/R1) which depends on the gain of the DC offset voltage Vmis_out. In this case, the component (Vmis×R2/R1) which depends on the gain of the DC offset voltage Vmis_out is substantially ignored.

In Step S415, the CPU 242 detects the DC offset voltage Vmis_out (substantially Vmis) converted to the digital signal by the A/DC 230.

In Step S420, the CPU 242 outputs a DC offset adjustment signal for attenuating the DC offset voltage Vmis_out to the voltage correction unit 210_2. The voltage correction unit 210_2 outputs a current control bit and a polarity inversion bit in accordance with the input signal.

In Step S425, the CPU 242 detects a DC offset voltage outputted from the A/DC 230. In Step S430, the CPU 242 determines whether the DC offset voltage detected in Step S425 is less than a predetermined voltage value (e.g., 5 mV). When it is determined that the detected DC offset voltage is less than the predetermined voltage value (YES in Step S430), the CPU 242 advances the processing to Step S435. On the other hand, when it is determined that the detected DC offset voltage exceeds the predetermined voltage value (NO in Step S430), the CPU 242 returns the processing to Step S420.

In Step S435, the CPU 242 outputs a signal for fixing the current control bit and the polarity inversion bit to the voltage correction unit 210_2. Consequently, the correction voltage Vcal2 outputted from the voltage correction unit 210_2 is fixed. Incidentally, in another aspect, the voltage correction unit 210 may be a configuration having a register (not shown) and in which a correction voltage is fixed in accordance with a DC offset adjustment signal inputted thereto last.

In Step S440, the CPU 242 outputs a gain switch signal to set the gain of the variable gain amplifier circuit VGA_1 to the maximum value. Consequently, the component (Vmis×R2/R1) which depends on the gain of the DC offset voltage Vmis_out becomes sufficiently larger than the component (Vmis) which does not depend on the gain thereof. In this case, the component (Vmis) which does not depend on the gain of the DC offset voltage Vmis_out is substantially ignored. Incidentally, in Step S440, the voltage correction unit 210_2 outputs the correction voltage Vcal2 set in Step S435 to thereby correct the component which does not depend on the gain of the DC offset voltage Vmis_out.

In Step S445, the CPU 242 detects the DC offset voltage Vmis_out (substantially Vmis×R2/R1) converted to the digital signal by the A/DC 230.

In Step S450, the CPU 242 outputs a DC offset adjustment signal for attenuating the DC offset voltage Vmis_out to the voltage correction unit 210_1. The voltage correction unit 210_1 outputs a current control bit and a polarity inversion bit in accordance with the input signal.

In Step S455, the CPU 242 detects a DC offset voltage outputted from the A/DC 230. In Step S460, the CPU 242 determines whether the DC offset voltage detected in Step S455 is less than a predetermined voltage value (e.g., 5 mV). When it is determined that the detected DC offset voltage is less than the predetermined voltage value (YES in Step S460), the CPU 242 advances the processing to Step S465. On the other hand, when it is determined that the detected DC offset voltage exceeds the predetermined voltage value (NO in Step S460), the CPU 242 returns the processing to Step S450.

In Step S465, the CPU 242 outputs a signal for fixing the current control bit and the polarity inversion bit to the voltage correction unit 210_1. Consequently, the correction voltage Vcal1 outputted from the voltage correction unit 210_1 is fixed.

In Step S470, the CPU 242 transmits an opening/closing signal to the switch 220 to bring the switch 220 to an OFF state, thereby leading to the completion of a series of correction processing.

According to the above, the variable gain amplifier 200 according to the one embodiment is capable of correcting the gain-independent component of the DC offset voltage Vmis_out by the voltage correction unit 210_2 located on the subsequent stage of the variable gain amplifier circuit VGA_1. Further, the variable gain amplifier 200 is capable of correcting the gain-dependent component of the DC offset voltage Vmis_out by the voltage correction unit 210_1 located in the pre-stage of the variable gain amplifier circuit VGA_1. Thus, even when the gain is changed, the variable gain amplifier 200 is capable of always correcting (attenuating) the DC offset voltage included in the differential output signal of the variable gain amplifier circuit VGA_1. Further, even when the gain is changed, the variable gain amplifier 200 does not require such special control as to change the respective voltage correction amounts of the voltage correction units 210_1 and 210_2. Therefore, the variable gain amplifier 200 does not require the configuration for detecting the DC offset voltage included in the differential output signal during its operation by the analog signal. Accordingly, the variable gain amplifier 200 can be made smaller in size than before. Further, the variable gain amplifier 200 can be reduced in power consumption.

(Receiving Device)

A configuration example of a receiving device will next be described as an example of a device equipped with the variable gain amplifier according to the embodiment described above.

Figure 5:
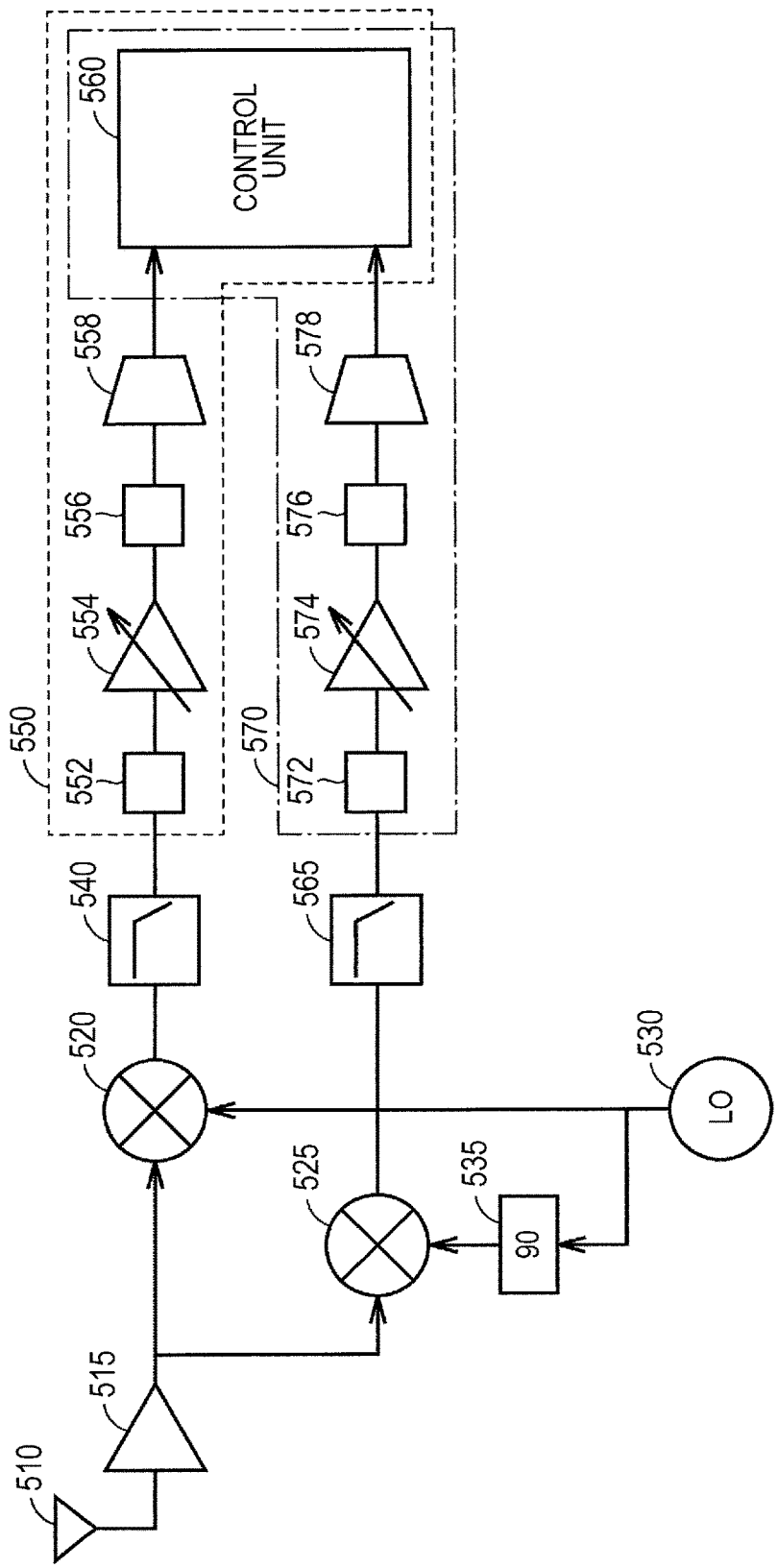
FIG. 5 is a diagram describing a configuration example of a receiving device 500 according to one embodiment.

FIG. 5 is a diagram describing a configuration example of a receiving device 500 according to one embodiment. Referring to FIG. 5, the receiving device 500 is equipped with an antenna 510, a low noise amplifier (LNA) 515, mixers 520 and 525, a local oscillator 530, a 90° phase shifter 535, low pass filters (LPF) 540 and 565, and variable gain amplifiers 550 and 570.

The LNA 515 amplifies an RF (Radio Frequency) signal received by the antenna 510 and outputs the amplified RF signal to the mixers 520 and 525. The mixer 520 generates heterodyne, based on the RF signal inputted from the LNA 515 and an oscillation signal outputted from the local oscillator 530 and outputs the same to the low pass filter 540. The low pass filter 540 selectively outputs only downside heterodyne low in frequency, of the input heterodyne to the variable gain amplifier 550.

The mixer 525 generates heterodyne, based on the RF signal inputted from the LNA 515 and an oscillation signal shifted in phase by 90°, which is inputted from the 90° phase shifter 535, and outputs the same to the low pass filter 565. The low pass filter 565 selectively outputs only downside heterodyne low in frequency, of the input heterodyne to the variable gain amplifier 570.

The variable gain amplifiers 550 and 570 have a common control unit 560. The variable gain amplifier 550 is further equipped with voltage correction units 552 and 556, a variable gain amplifier circuit 554, and an A/DC 558. The variable gain amplifier 570 is further equipped with voltage correction units 572 and 576, a variable gain amplifier circuit 574, and an A/DC 578. The variable gain amplifiers 550 and 570 respectively perform the same operation as that of the variable gain amplifier 200 described in FIG. 2. More specifically, the voltage correction units 552 and 572 respectively perform the same operation as that of the voltage correction unit 210_1. The voltage correction units 554 and 574 respectively perform the same operation as that of the voltage correction unit 210_2. The variable gain amplifier circuits 554 and 574 respectively perform the same operation as that of the variable gain amplifier circuit VGA_1. The A/DC 558 and 578 respectively perform the same operation as that of the A/DC 230. A detailed description of these devices will therefore not be repeated.

The variable gain amplifiers 550 and 570 respectively amplify or suppress the input downside heterodyne to a prescribed signal level and digitally process the same by the control unit 560.

The receiving device 500 conforming to the direct conversion system shown in FIG. 5 directly converts the RF signal received by the antenna 510 into a low frequency including a DC component and amplifies the same. At this time, the basic characteristics of the received signal may deteriorate due to DC offset voltages generated in the variable gain amplifier circuits 554 and 574. Therefore, the receiving device 500 corrects the DC offset voltages by the voltage correction units 552 and 556, 572, and 576 respectively.

Meanwhile, IEEE (Bluetooth (Trademark Registration) (Bluetooth Classic of Versions 1 to 3 and Bluetooth Low Energy (BLE) of Version 4) of Institute of Electrical and Electronics Engineers) standard 802.15.1)) has only a preamble period of 8 usecs. Further, these adopt amodulation system (e.g., BLE: GFSK (Gaussian Frequency-Shift Keying) modulation system of modulation index m=0.5, and Bluetooth Classic: GFSK modulation system of modulation index m=0.3) in which a signal component is concentrated in the vicinity of a carrier frequency. When a signal conforming such a wireless standard is received, there is a need to perform the determination of a communication frequency (channel) and a gain setting on the preamble period (8 usecs). Therefore, the time when it is possible to substantially perform the gain setting (AGC) is only a few usecs. Since the related art receiving device (variable gain amplifier circuit) has required a few tens of usecs for the correction of the DC offset voltage, it was difficult to correct the DC offset voltage during the preamble period.

On the other hand, even when the gains of the variable gain amplifier circuits 554 and 574 are changed during the operation where the respective correction voltages of the voltage correction units 552, 556, 572, and 576 are set at power-on or the like, the receiving device 500 according to the one embodiment is capable of correcting the DC offset voltages without performing such special control as to change the respective voltage correction amounts. Therefore, even when the signal conforming to the wireless standard short in gain setting period such as described above is received, the receiving device 500 can correct the DC offset voltages.

Incidentally, in another aspect, the low pass filters 540 and 565 may be arranged in a subsequent stage of the variable gain amplifier 550 rather than its preceding stage. In yet another aspect, the receiving device 500 may have a configuration in which a plurality of stages of the variable gain amplifier circuits 554 and 574 are provided and the low pass filters 540 and 565 are arranged between the respective variable gain amplifier circuits.

Further, although the receiving device described above has adopted the direct conversion system, the receiving device may adopt another system (e.g., sliding IF (Intermediate Frequency) system) in another aspect. In yet another aspect, each of the variable gain amplifier circuits 554 and 574 may add a capacitor to an internal feedback path to have a function of a low pass filter, or may be of a biquad configuration.

[Embodiment 2]

In the example shown in FIG. 4, the variable gain amplifier 200 sets the correction voltage of the voltage correction unit 210, based on the level of the DC offset voltage outputted from the A/DC 230. The variable gain amplifier 200 according to another embodiment is capable of setting the correction voltage of the voltage correction unit 210, based on the presence or absence of inversion of the polarity (positive/negative) of the DC offset voltage outputted from the A/DC 230.

Figure 6:
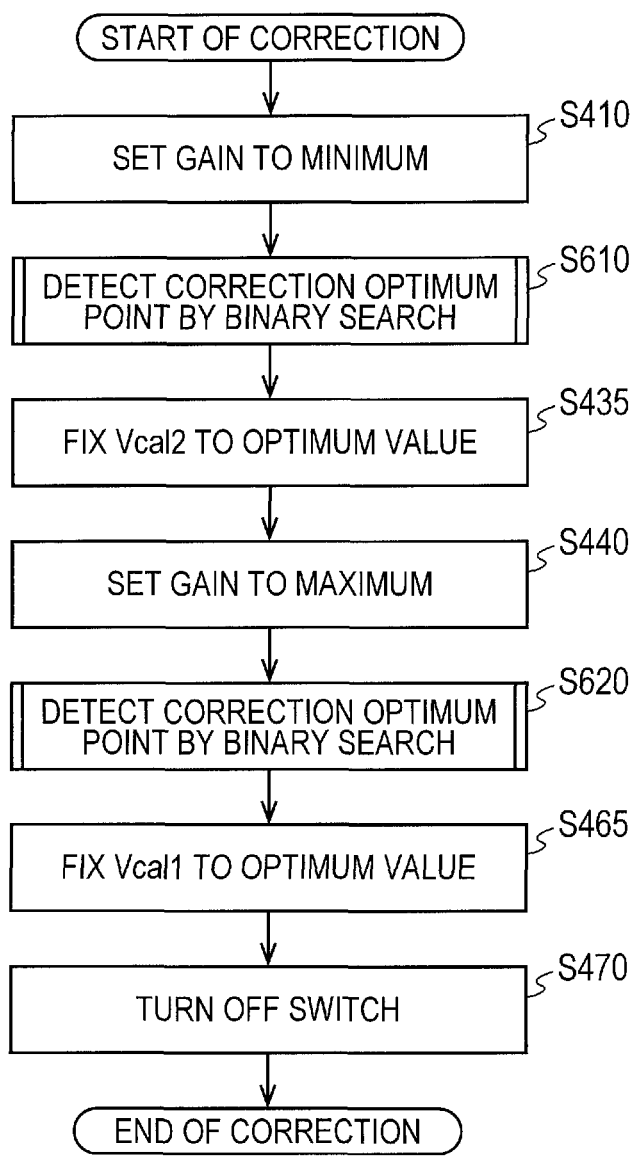
FIG. 6 is a flowchart describing a method of correcting a DC offset voltage according to another embodiment.

FIG. 6 is a flowchart describing a method of correcting the DC offset voltage according to another embodiment. Processing shown in FIG. 6 is realized by executing the control program stored in the ROM 246 by the CPU 242. In another aspect, a part or all of the processing may be executed by a circuit element or another hardware. The processing shown in FIG. 6 can be executed at power-on of the variable gain amplifier 200 or in an initialization sequence for its operation start. Incidentally, since the parts given the same symbols as those in FIG. 4 are the same processing, the description of their parts will not be repeated.

In Step S610, the CPU 242 sets an optimum value of the correction voltage Vcal2 of the voltage correction unit 210_2 by a binary search. In Step S620, the CPU 242 sets an optimum value of the correction voltage Vcal1 of the voltage correction unit 210_1 by a binary search. Specific processing of Steps S610 and S620 will be described using FIG. 7.

Figure 7:
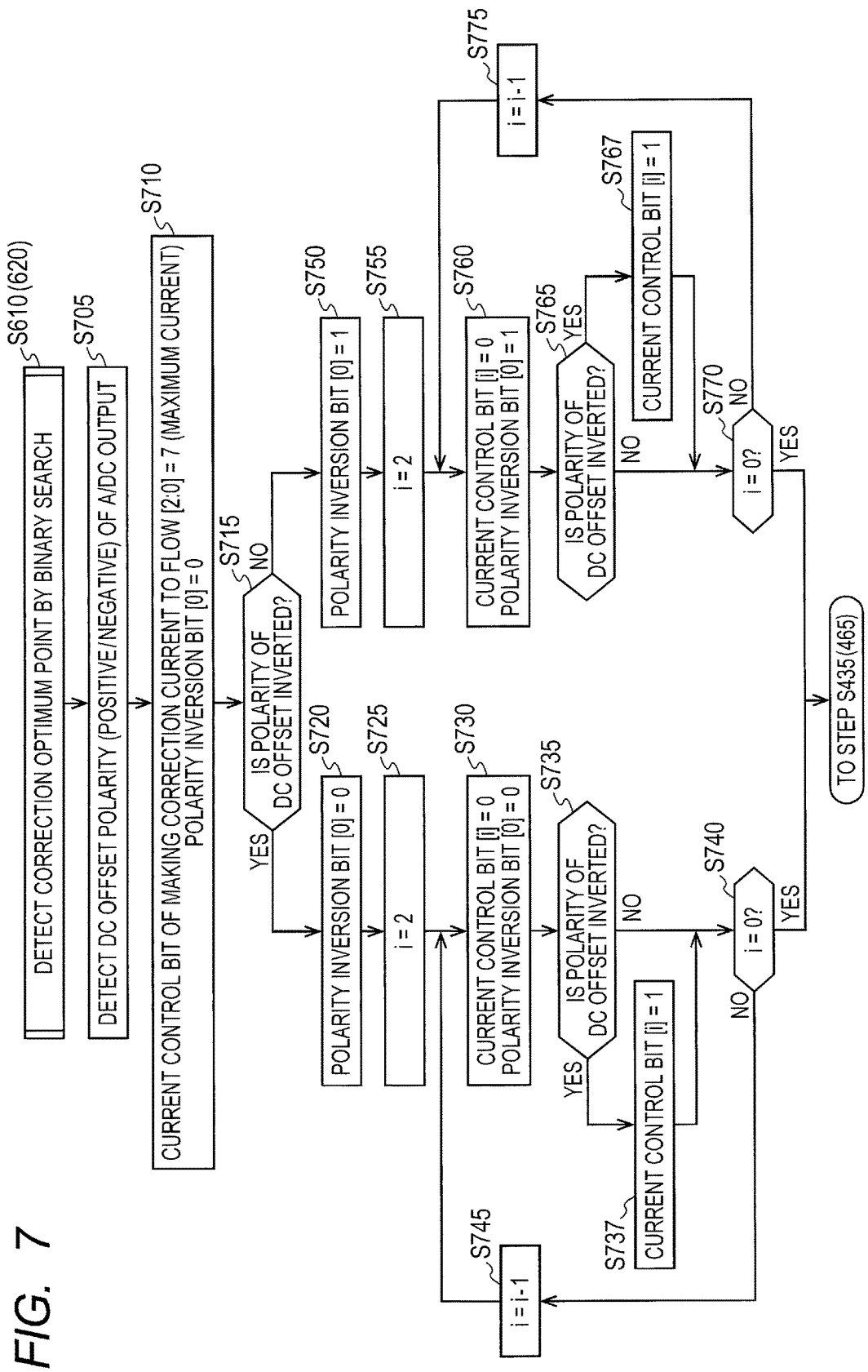
FIG. 7 is a flowchart for describing Steps S610 (and S620) of FIG. 6.

FIG. 7 is a flowchart for describing Steps S610 (and S620) of FIG. 6. In FIG. 7, the description of Step S610 will be made as an example. Incidentally, in the example shown in FIG. 7, the bit length of a current control bit outputted from the logic control part 300 of the voltage correction unit 210_2 is assumed to be 3 bits. As one example, the logic control part 300 controls the current control bit between 0 (minimum) and 7 (maximum) and linearly changes the amount of current outputted from the variable current source Ical in eight stages. Incidentally, in another aspect, the bit length of the current control bit can be set to an optimum value, based on the accuracy of correction of the DC offset voltage and its correction time.

In Step S705, the CPU 242 detects the polarity (positive/negative) of a DC offset voltage Vmis_out (substantially Vmis) from the A/DC 230. As one example, the CPU 242 determines as positive where a DC potential on the T side (OUTT terminal side of voltage correction unit 210_2) is higher than a DC potential on the B side (OUTB side of voltage correction unit 210_2).

In Step S710, the CPU 242 outputs a DC offset adjustment signal to the voltage correction unit 210_2. The voltage correction unit 210_2 sets a current control bit to "111" (i.e., 7) and a polarity inversion bit to "0" (Low) respectively according to the input signal. Thus, the voltage correction unit 210_2 causes the maximum amount of correction voltage Vcal2 to be generated on the B side. Incidentally, the maximum amounts of correction voltages Vcal2 (and Vcal1) are assumed to be sufficiently larger than a variation range of the DC offset voltage. In another aspect, the polarity inversion bit may be set to "1" in Step S710.

In Step S715, the CPU 242 determines whether the polarity of the DC offset voltage outputted from the A/DC 230 is inverted. When it is determined that the polarity of the DC offset voltage is inverted (YES in Step S715), the CPU 242 advances the processing to Step S720. On the other hand, when it is determined that the polarity of the DC offset voltage is not inverted (NO in Step S715), the CPU 242 advances the processing to Step S750.

In Step S720, the CPU 242 holds the polarity inversion bit to remain at "0". In Step S725, the CPU 242 sets a bit i (0, 1, 2 in order from a low-order bit) of a setting target for the current control bit of the logic control part 300 to "2" (i.e., most significant bit).

In Step S730, the CPU 242 sets the most significant bit of the current control bit to "0" and the polarity inversion bit to "0" respectively. In Step S735, the CPU 242 determines whether the polarity of the DC offset voltage outputted from the A/DC 230 is inverted. When it is determined that the polarity of the DC offset voltage is inverted (YES in Step S735), the CPU 242 advances the processing to Step S737. On the other hand, when it is determined that the polarity of the DC offset voltage is not inverted (NO in Step S735), the CPU 242 advances the processing to Step S740.

In Step S737, the CPU 242 sets the current control bit of the setting target bit i to "1".

In Step S740, the CPU 242 determines whether the setting target bit i for the current control bit is "0". When it is determined that the setting target bit i is "0" (YES in Step S740), the CPU 242 advances the processing to Step S435. On the other hand, when it is determined that the setting target bit i is not "0" (NO in Step S740), the CPU 242 advances the processing to Step S745.

In Step S745, the CPU 242 sets the setting target bit i for the current control bit to the next lower-order bit. In one aspect, the CPU 242 changes the setting target bit i for the current control bit from "2" to "1" (middle-order bit).

In Step S750, the CPU 242 changes the polarity inversion bit from "0" to "1". In Step S755, the CPU 242 sets the setting target bit i for the current control bit to "2".

In Step S760, the CPU 242 sets the most significant bit of the current control bit to "0" and the polarity inversion bit to "1" respectively. In Step S765, the CPU 242 determines whether the polarity of the DC offset voltage outputted from the A/DC 230 is inverted. When it is determined that the polarity of the DC offset voltage is inverted (YES in Step S765), the CPU 242 advances the processing to Step S767. On the other hand, when it is determined that the polarity of the DC offset voltage is not inverted (NO in Step S765), the CPU 242 advances the processing to Step S770.

In Step S767, the CPU 242 sets the current control bit of the setting target bit i to "1".

In Step S770, the CPU 242 determines whether the setting target bit i for the current control bit is "0". When it is determined that the setting target bit i is "0" (YES in Step S770), the CPU 242 advances the processing to Step S435. On the other hand, when it is determined that the setting target bit i is not "0" (NO in Step S770), the CPU 242 advances the processing to Step S775.

In Step S775, the CPU 242 sets the setting target bit i for the current control bit to the next lower-order bit. In one aspect, the CPU 242 changes the setting target bit i for the current control bit from "2" to "1" (middle-order bit).

According to the above, the variable gain amplifier 200 according to the one embodiment is capable of setting the correction voltage of the voltage correction unit 210, based on the presence or absence of the polarity (positive/negative) of the DC offset voltage outputted from the A/DC 230.

The above correction control of DC offset voltage will be described using a concrete example. As one example, assume that the DC offset voltage Vmis_out is generated as +5 mV, and the application range of the correction voltage of the voltage correction unit 210 is ±24 mV.

In Step S705, the CPU 242 determines that the polarity of the DC offset voltage Vmis_out is positive. In Step S710, the CPU 242 applies the correction voltage of +24 mV. Consequently, the DC offset voltage outputted from the A/DC 230 becomes 29 mV. In Step S715, the CPU 242 advances the processing to Step S750 with the polarity of the DC offset voltage detected by the A/DC 230 being not inverted.

In Step S750, the CPU 242 changes the polarity inversion bit from "0" to "1". In Step S755, the CPU 242 sets the setting target bit i for the current control bit to "2" (control bit of 12 mV). Thus, the correction voltage of −24 mV is applied and the DC offset voltage becomes −19 mV.

In Step S760, the CPU 242 brings the most significant current control bit to "0" and sets the polarity inversion bit to "1". Thus, a correction voltage of −12 mV is applied and the DC offset voltage outputted from the A/DC 230 becomes −7 mV. In Step S765, the CPU 242 determines that the polarity of the pre-correction offset voltage (−19 mV) and the polarity of the post-correction offset voltage (−7 mV) are the same (NO in Step S765), and advances the processing to Step S770 with the most significant current control bit remaining changed to "0".

In Step S770, the CPU 242 determines that the setting target bit i is not "0", and advances the processing to Step S775, where the setting target bit i for the current control bit is changed from "2" to "1".

In Step S760, the CPU 242 brings the middle-order current control bit (control bit of 6 mV) to "0" and sets the polarity inversion bit to "1". Consequently, a correction voltage of −6 mV is applied and the DC offset voltage outputted from the A/DC 230 becomes −1 mV. In Step S765, the CPU 242 determines that the polarity of the pre-correction offset voltage (−7 mV) and the polarity of the post-correction offset voltage (−1 mV) are the same (NO in Step S765), and advances the processing to Step S770 with the middle-order current control bit remaining changed to "0".

In Step S770, the CPU 242 determines that the setting target bit i is not "0" and advances the processing to Step S775, where the setting target bit i for the current control bit is changed from "1" to "0".

In Step S760, the CPU 242 brings the least significant current control bit (control bit of 3 mV) to "0" and sets the polarity inversion bit to "1". Consequently, a correction voltage of −3 mV is applied and the DC offset voltage outputted from the A/DC 230 becomes +2 mV. In Step S765, the CPU 242 determines that the polarity of the pre-correction offset voltage (−1 mV) and the polarity of the post-correction offset voltage (+2 mV) are different from each other (YES in Step S765). Then, the CPU 242 changes the least significant current control bit to "1" and advances the processing to Step S770.

In Step S770, the CPU 242 determines that the setting target bit i is "0" and advances the processing to Step S435.

According to the above, the variable gain amplifier 200 according to the embodiment is capable of correcting (attenuating) the DC offset voltage of 5 mV generated in the variable gain amplifier circuit VGA_1 to −1 mV.

Incidentally, in another aspect, the ROM 246 of the variable gain amplifier 200 is capable of storing in advance a relation between the polarity inversion bit and the positive/negative polarity of the A/DC 230. In this case, the CPU 242 can omit the processing of Steps S710, S715, and S755 shown in FIG. 7.

[Embodiment 3]

Although the variable gain amplifier is configured in the signal stage in the above example, the present embodiment will describe a method of correcting a DC offset voltage where there are a plurality of stages of variable gain amplifier circuits.

Figure 8:
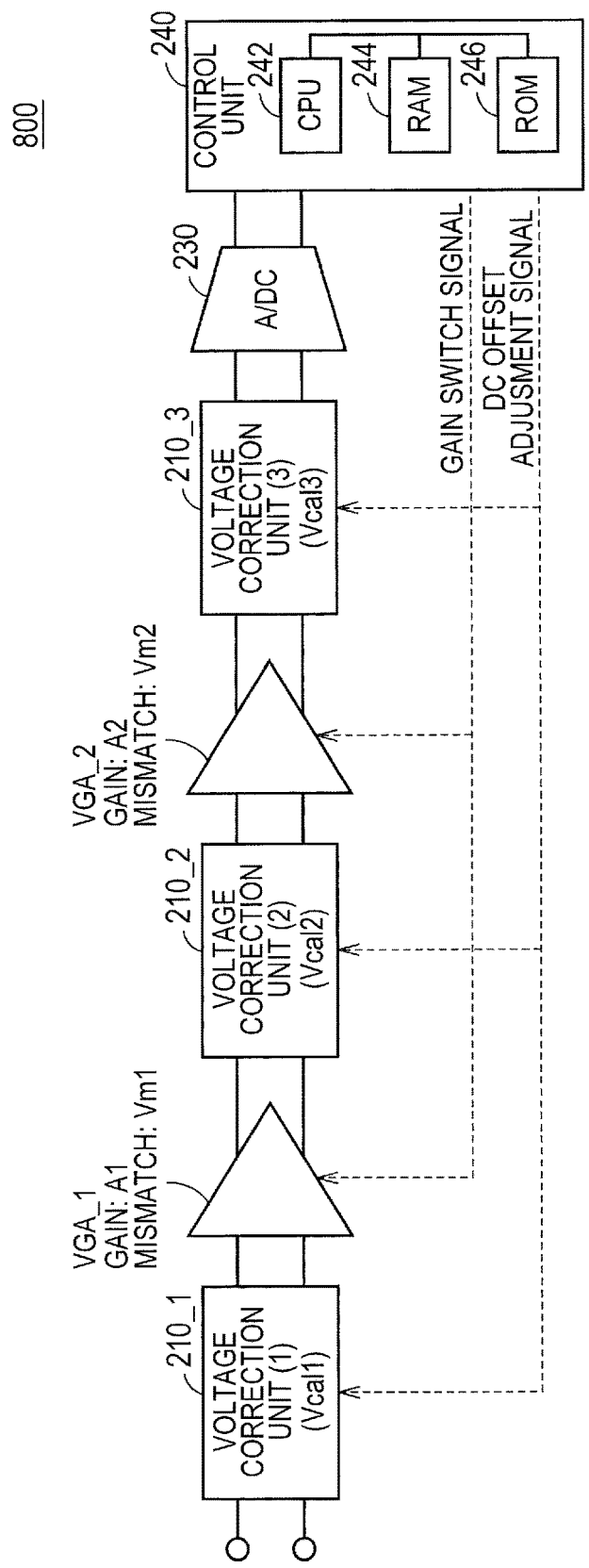
FIG. 8 is a diagram describing a configuration example of a variable gain amplifier 800 according to one embodiment.

FIG. 8 is a diagram describing a configuration example of a variable gain amplifier 800 according to one embodiment. Referring to FIG. 8, the variable gain amplifier 800 is further equipped with a variable gain amplifier circuit VGA_2 and a voltage correction unit 210_3 as compared with the variable gain amplifier 200 described in FIG. 2. Incidentally, since parts given the same symbols as those in FIG. 2 are the same, the description of the parts will not be repeated.

The control unit 240 is further coupled to the variable gain amplifier circuit VGA_2 and the voltage correction unit 210_3. The control unit 240 outputs a gain switch signal to the variable gain amplifier circuits VGA_1 and VGA_2. The control unit 240 outputs a DC offset adjustment signal to the voltage correction units 210_1, 210_2, and 210_3.

The gain of the variable gain amplifier circuit VGA_1 is assumed to be A1, and the mismatch voltage is assumed to be Vm1. The gain of the variable gain amplifier circuit VGA_2 is assumed to be A2, and the mismatch voltage is assumed to be Vm2. At this time, DC offset voltages generated by the two stages of variable gain amplifier circuits VGA_1 and VGA_2 can be represented by the following equation (3):

$$Vm1 \times (1+A1) \times A2 + Vm2 \times (1+A2) = Vm1 \times A1 \times A2 + (Vm1 + Vm2)A2 + Vm2 \quad (3)$$

A description will next be made of a method of correcting the DC offset voltages expressed in the equation (3) using FIG. 9 through the use of the voltage correction units 210_1, 210_2, and 210_3.

Figure 9:
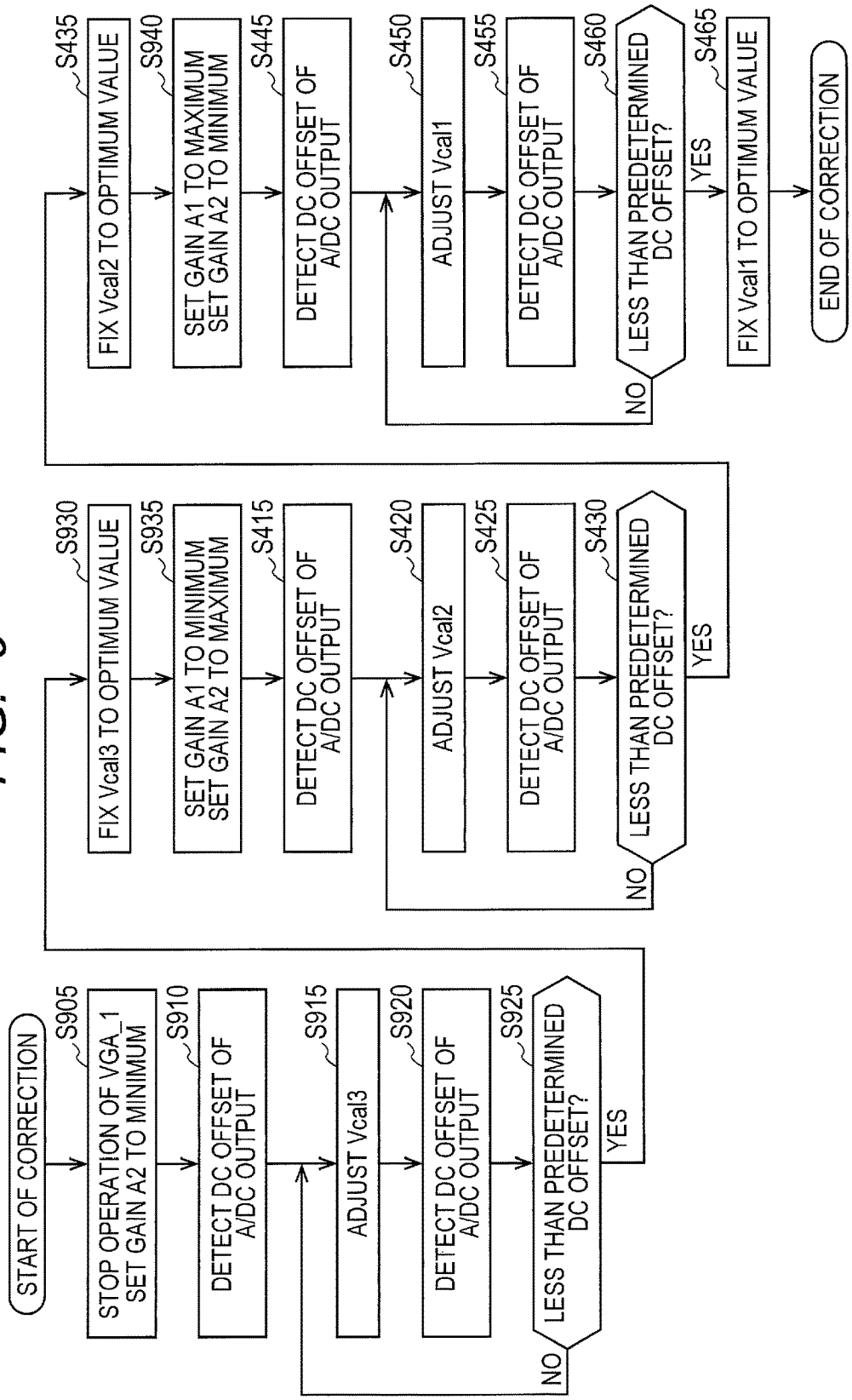
FIG. 9 is a flowchart describing a method of correcting a DC offset voltage in the variable gain amplifier 800 according to the one embodiment.

FIG. 9 is a flowchart describing the method of correcting the DC offset voltages in the variable gain amplifier 800 according to the one embodiment. Processing shown in FIG. 9 is realized by executing a control program stored in the ROM 246 by the CPU 242. In another aspect, a part or all of the processing may be executed by a circuit element or another hardware. The processing shown in FIG. 9 can be executed at power-on of the variable gain amplifier 800 or in an initialization sequence for its operation start. In one aspect, a correction voltage Vcal1 of the voltage correction unit 210_1, a correction voltage Vcal2 of the voltage correction unit 210_2, and a correction voltage Vcal3 of the voltage correction unit 210_3 can respectively be set to 0 at the start time of the processing shown in FIG. 9. Incidentally, since parts given the same symbols as those in FIG. 4 are the same processing, the description of the parts will not be repeated.

In Step S905, the CPU 242 stops the operation of the variable gain amplifier circuit VGA_1. Thus, in the equation (3), the DC offset voltage Vm1 generated by the variable gain amplifier circuit VGA_1 can substantially be ignored. In the same Step, the CPU 242 sets the gain A2 of the variable gain amplifier circuit VGA_2 to the minimum value. Consequently, the component (third term) which does not depend on the gain A2 becomes sufficiently larger than the components (first and second terms) which depend on the gain A2 in the equation (3). In this case, it is possible to substantially ignore the first and second terms in the equation (3).

In Step S910, the CPU 242 detects the DC offset voltage (substantially Vm2) inputted from the A/DC 230. In Step S915, the CPU 242 outputs such a DC offset adjustment signal as to attenuate the DC offset voltage to the voltage correction unit 210_3. The voltage correction unit 210_3 outputs a current control bit and a polarity inversion bit in accordance to the input signal.

In Step S920, the CPU 242 detects the DC offset voltage (Vm2) inputted from the A/DC 230. In Step S925, the CPU 242 determines whether the DC offset voltage detected in Step S920 is less than a predetermined voltage value (e.g., 5 mV). When it is determined that the detected DC offset voltage is less than the predetermined voltage value (YES in Step S925), the CPU 242 advances the processing to Step S930. On the other hand, when it is determined that the DC offset voltage exceeds the predetermined voltage value (NO in Step S925), the CPU 242 returns the processing to Step S915.

In Step S930, the CPU 242 outputs a signal for fixing the current control bit and the polarity inversion bit to the voltage correction unit 210_3. Thus, the correction voltage Vcal3 outputted from the voltage correction unit 210_3 is fixed.

The variable gain amplifier 800 performs the above series of processing to thereby set the correction voltage Vcal3 of the voltage correction unit 210_3 for correcting (eliminating) the component which does not depend on the gain of the variable gain amplifier circuit VGA_2. Incidentally, in another aspect, the variable gain amplifier 800 can be provided with a switch configured to make it possible to short-circuit two conductors input to the voltage correction unit 210_1 as with FIG. 2. Thus, the variable gain amplifier 800 is capable of suppressing a deviation of the correction voltage Vcal3 due to a fluctuation in LDO (Low DropOut voltage regulator) load with the stop of operation of the variable gain amplifier circuit VGA_1. Further, since it becomes unnecessary to restart the variable gain amplifier circuit VGA_1, the variable gain amplifier 800 is capable of reducing an offset voltage correcting time.

In Step S935, the CPU 242 sets the gain A1 of the variable gain amplifier circuit VGA_1 to the minimum value and sets the gain A2 of the variable gain amplifier circuit VGA_2 to the maximum value. Thus, the second term becomes sufficiently larger than the first term in the equation (3). Further, the third term is corrected by the voltage correction unit 210_3. In this state, the CPU 242 performs the above-described processing of Steps S415 through S435 to thereby set the correction voltage Vcal2 of the voltage correction unit 210_2, for correcting the component (second term in equation (3)) which depends on the gain A2 of the variable gain amplifier circuit VGA_2.

In Step S940, the CPU 242 sets the gain A1 of the variable gain amplifier circuit VGA_1 to the maximum value and sets the gain A2 of the variable gain amplifier circuit VGA_2 to the minimum value. Thus, the first term becomes sufficiently larger than the second and third terms of the equation (3). Further, the third term is corrected by the voltage correction unit 210_3, and the second term is corrected by the voltage correction unit 210_2, respectively. In this state, the CPU 242 performs the above-described processing of Steps S450 through S455 to thereby set the correction voltage Vcal1 of the voltage correction unit 210_1, for correcting the component (first term in equation (3)) which depends on the gain A1 of the variable gain amplifier circuit VGA_1.

According to the above, the variable gain amplifier 800 according to the one embodiment is capable of correcting the DC offset voltage that may be caused by each variable gain amplifier circuit, even if the variable gain amplifier circuits are of two stages.

A further description will next be made about a case where there are n stages (wherein n: integer and n≥3) of variable gain amplifier circuits, using FIGS. 10 and 11.

Figure 10:
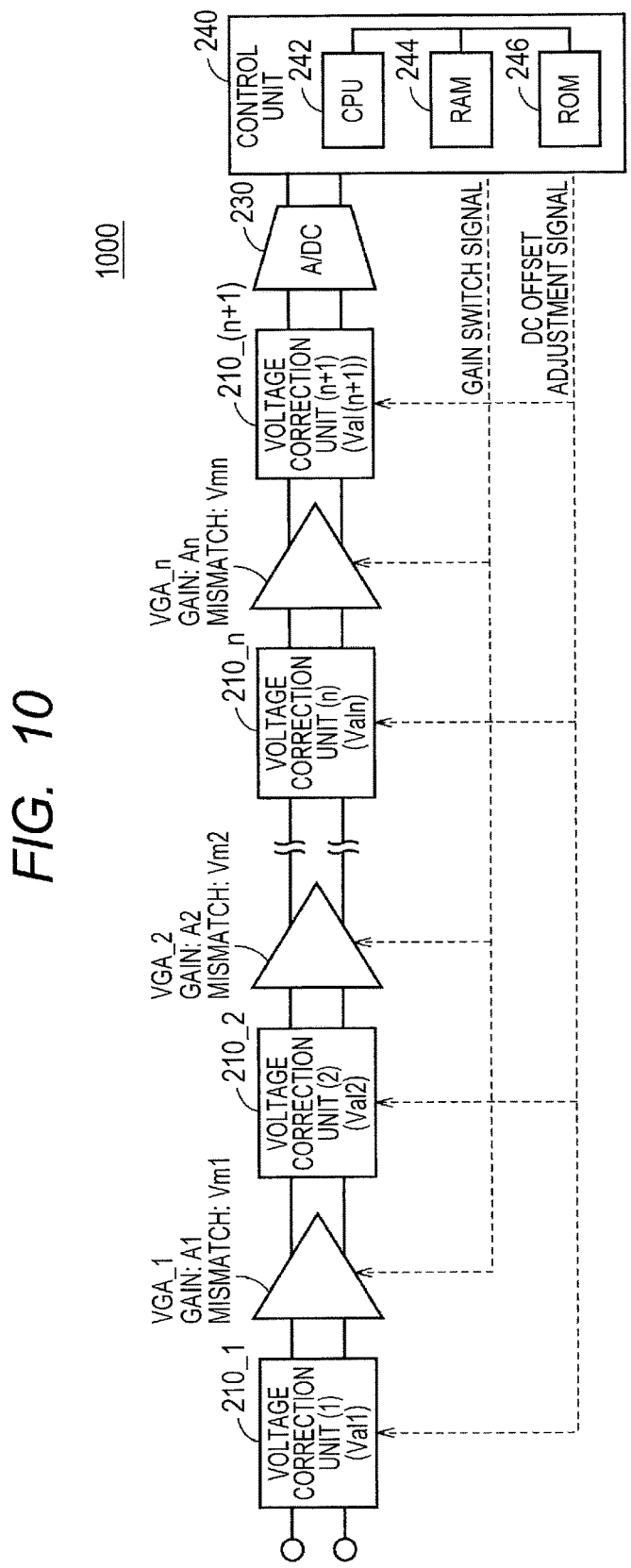
FIG. 10 is a diagram describing a configuration example of a variable gain amplifier 1000 according to one embodiment.

FIG. 10 is a diagram describing a configuration example of a variable gain amplifier 1000 according to one embodiment. Referring to FIG. 10, the variable gain amplifier 1000 is equipped with n stages of variable gain amplifier circuits VGA_1, VGA_2, . . . , and VGA_n. The variable gain amplifier 1000 is equipped with n+1 stages of voltage correction units 210_1, 210_2, . . . , 210_n, and 210_(n+1) in the preceding stage of the variable gain amplifier circuit VGA_1, between the respective variable gain amplifier circuits, and in the subsequent stage of the variable gain amplifier circuit VGA_n. Since the variable gain amplifier 1000 is similar in other configuration to the variable gain amplifier 200 described in FIG. 2, the description thereof will not be repeatedly made.

Gains of the variable gain amplifier circuits VGA_1, VGA 2, . . . , and VGA_n are respectively assumed to be A1, A2, . . . , and An. Also, mismatch voltages of the variable gain amplifier circuits VGA_1, VGA 2, . . . , and VGA_n are respectively assumed to be Vm1, Vm2, . . . , and Vmn. Further, correction voltages outputted from the voltage correction units 210_1, 210_2, . . . , 210_n, and 210_(n+1)

are respectively assumed to be Vcal1, Vcal2, . . . , Vcaln, and Vcal (n+1). At this time, DC offset voltages generated by the variable gain amplifier circuits VGA_1, VGA_2, . . . , and VGA_n can be represented by the following equation (4):

$$Vm1 \times A1 \times A2 \times \ldots \times An + (Vm1+Vm2) \times A2 \times \ldots \times An + \ldots + (Vm1+Vm2+\ldots+Vmn) \times An + Vmn \quad (4)$$

Figure 11:
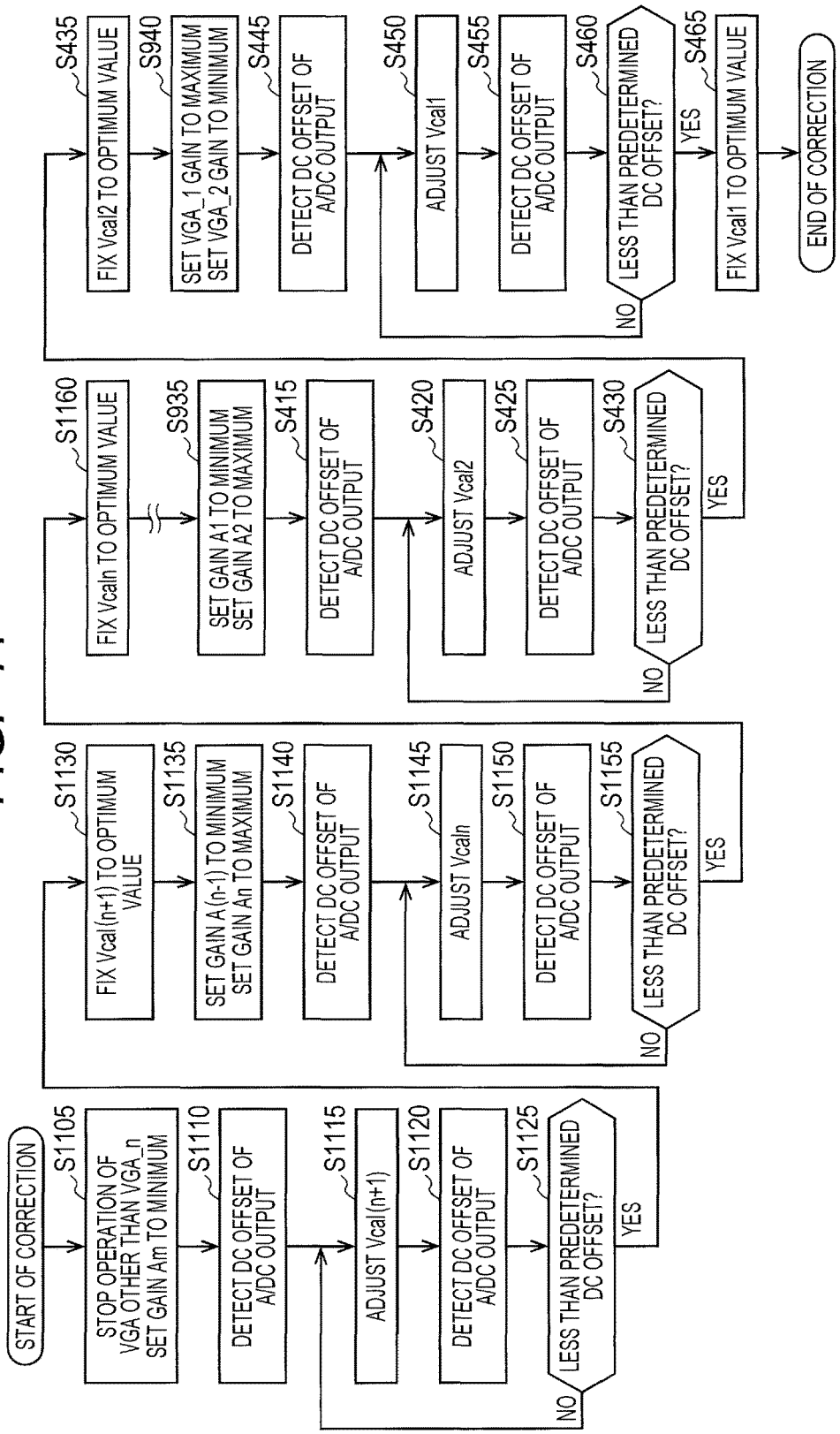
FIG. 11 is a flowchart describing a method of correcting a DC offset voltage in the variable gain amplifier 1000 according to the one embodiment.

FIG. 11 is a flowchart describing a method of correcting DC offset voltages in the variable gain amplifier 1000 according to the one embodiment. Processing shown in FIG. 11 is realized by executing a control program stored in the ROM 246 by the CPU 242. In another aspect, a part or all of the processing may be executed by a circuit element or another hardware. The processing shown in FIG. 11 can be executed at power-on of the variable gain amplifier 1000 or in an initialization sequence for its operation start. In one aspect, the correction voltages Vcal1, Vcal2, . . . , Vcaln, and Vcal (n+1) can respectively be set to 0 at the start time of the processing shown in FIG. 11. Incidentally, since parts given the same symbols as those in FIG. 9 are the same processing, the description of the parts will not be repeated.

In Step S1105, the CPU 242 stops the operations of the variable gain amplifier circuits other than the variable gain amplifier circuit VGA_n and sets the gain An of the variable gain amplifier circuit VGA_n to the minimum value. Thus, the components other than the component (n+1th term in equation (4), i.e., Vmn) which does not depend on the gain An of the variable gain amplifier circuit VGA_n in the equation (4) can substantially be ignored.

Since the processing of Steps S1110 through S1130 is substantially the same as that of Steps S910 through S930 described in FIG. 9, the description thereof will not be repeated. The CPU 242 performs the processing of Steps S1110 through S1130 to thereby set the correction voltage Vcal (n+1) of the voltage correction unit 210 (n+1) for correcting (eliminating) the component which does not depend on the gain of the variable gain amplifier circuit VGA_n.

In Step S1135, the CPU 242 sets the gain An−1 of the variable gain amplifier circuit VGA_n−1 to the minimum value and sets the gain An of the variable gain amplifier circuit VGA_n to the maximum value. Consequently, the nth item becomes sufficiently larger than the first item through n−1th item in the equation (4). Further, the n+1th item is corrected by the voltage correction unit 210_n. In this state, the CPU 242 executes processing shown in Steps S1140 through S1160 to set the correction voltage Vcaln of the voltage correction unit 210_n for correcting the component (nth item) which depends on the gain of the variable gain amplifier circuit VGA_n. Incidentally, since the processing of Steps S1140 through S1160 is substantially the same as that of Steps S910 through S930 described in FIG. 9, the description thereof will not be repeated.

The variable gain amplifier 1000 similarly sets the correction voltages in order from the voltage correction unit 210 disposed at the subsequent stage thereof.

According to the above, the variable gain amplifier 1000 according to the one embodiment is capable of correcting the DC offset voltages generated by the respective variable gain amplifier circuits even if the variable gain amplifier circuits are of n stages.

[Embodiment 4]

The variable gain amplifier described above is configured to correct the DC offset voltage generated in the variable gain amplifier circuit by the two voltage correction units 210 disposed at the preceding and subsequent stages of the variable gain amplifier circuit. More specifically, the voltage correction unit 210 disposed at the preceding stage of the variable gain amplifier circuit corrects the component which depends on the gain of the variable gain amplifier circuit, and the voltage correction unit 210 disposed at the subsequent stage thereof corrects the component which does not depend on the gain thereof. A variable gain amplifier according to an embodiment 4 corrects by digital processing a component which does not depend on the gain of a variable gain amplifier circuit without arranging a voltage correction unit 210 as a circuit at the subsequent stage of the variable gain amplifier circuit.

Figure 12:
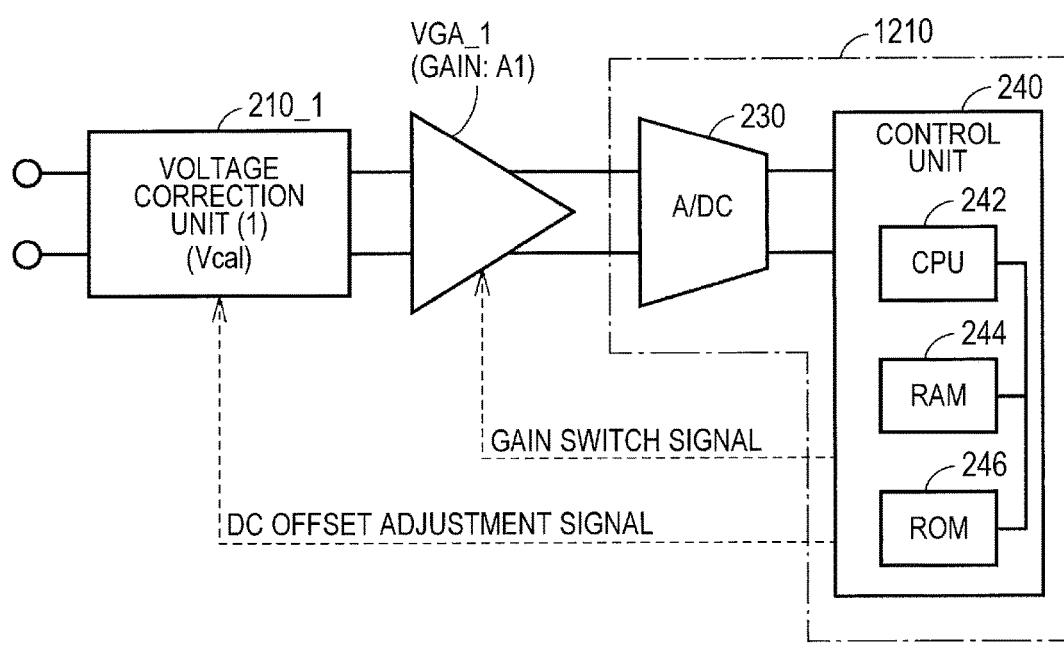
FIG. 12 is a diagram describing a configuration example of a variable gain amplifier 1200 according to one embodiment.

FIG. 12 is a diagram describing a configuration example of a variable gain amplifier 1200 according to one embodiment. Referring to FIG. 12, the variable gain amplifier 1200 has no voltage correction unit 210_2 as compared with the variable gain amplifier 200 shown in FIG. 2. Incidentally, since parts given the same symbols as those in FIG. 2 are the same, the description thereof will not be repeated.

Figure 13:
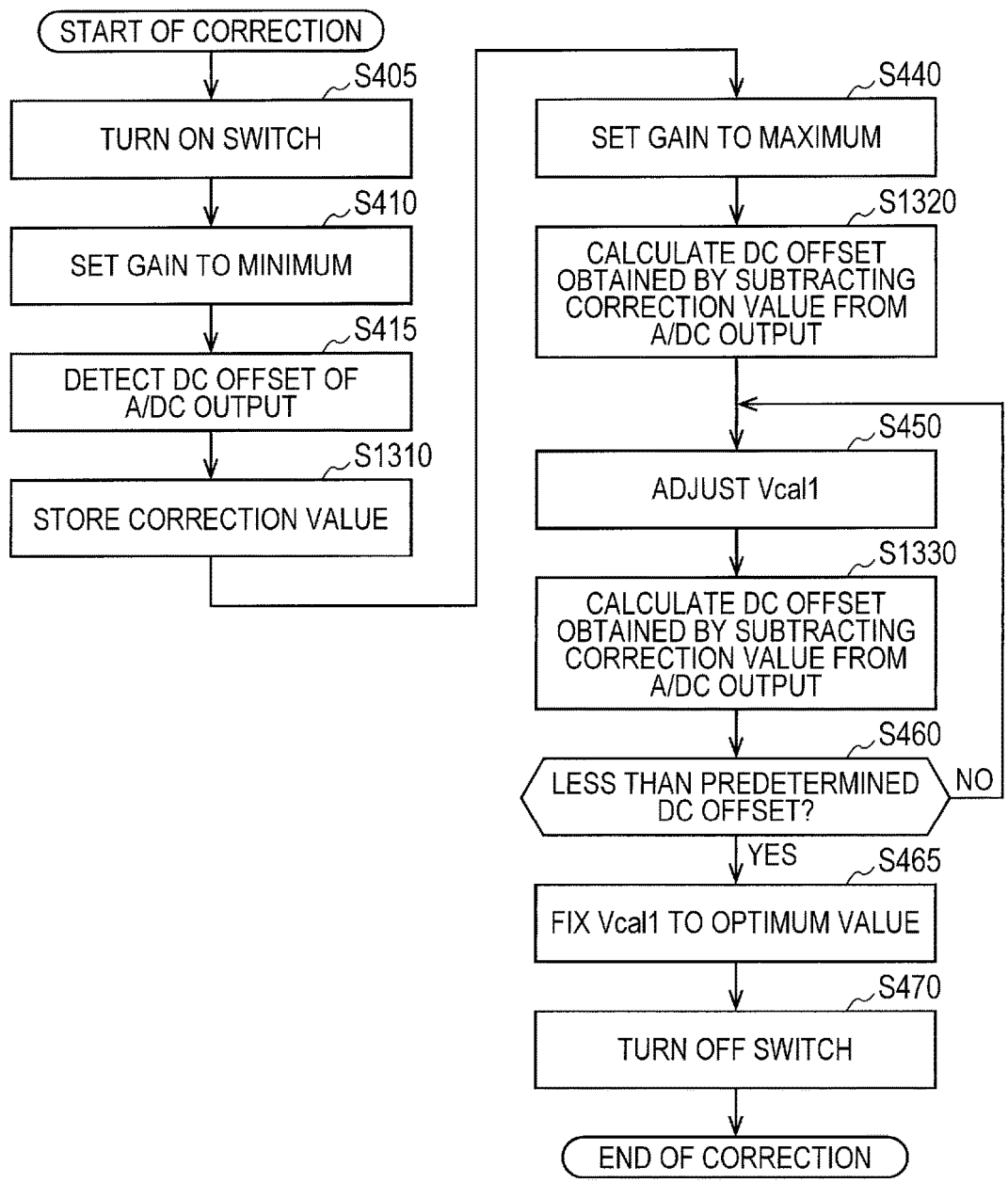
FIG. 13 is a diagram describing a method of correcting a DC offset voltage in the variable gain amplifier 1200 according to the one embodiment.

FIG. 13 is a flowchart describing a method of correcting a DC offset voltage in the variable gain amplifier 1200 according to the one embodiment. Processing shown in FIG. 12 is realized by executing a control program stored in the ROM 246 by the CPU 242. In another aspect, a part or all of the processing may be executed by a circuit element or another hardware. The processing shown in FIG. 12 can be executed at power-on of the variable gain amplifier 1200 or in an initialization sequence for its operation start. In one aspect, the correction voltages Vcal1 of the voltage correction unit 210_1 can be set to 0 at the start time of the processing shown in FIG. 12. Incidentally, since parts given the same symbols as those in FIG. 4 are the same processing, the description of the parts will not be repeated.

In Step S1310, the CPU 242 stores a DC offset voltage (substantially Vmis) detected by the A/DC 230 in Step S415 in the ROM 246 as a correction value.

In Step S1320, the CPU 242 detects the output of the A/DC 230 in a state in which the gain of the voltage correction unit 210_1 is made maximum. In the same Step, the CPU 242 calculates a value obtained by subtracting the correction value from the output of the A/DC 230 as a DC offset voltage.

In Step S450, the CPU 242 outputs such a DC offset adjustment signal as to attenuate the DC offset voltage calculated in Step S1320 to the voltage correction unit 210_1.

In Step S1330, the CPU 242 calculates a value obtained by subtracting the correction value from the output of the A/DC 230 as a DC offset voltage.

In Step S460, the CPU 242 determines whether the DC offset voltage calculated in Step S1330 is less than a predetermined voltage value (e.g., 5 mV). When it is determined that the calculated DC offset voltage is less than the predetermined voltage value (YES in Step S460), the CPU 242 advances the processing to Step S465. On the other hand, when it is determined that the calculated DC offset voltage exceeds the predetermined voltage value (NO in Step S460), the CPU 242 returns the processing to Step S450.

According to the above, the variable gain amplifier 1200 according to the one embodiment is capable of correcting the DC offset voltage which may be generated in the variable gain amplifier circuit VGA_1. Further, the variable gain amplifier 1200 has no voltage correction unit 210_2 as an analog circuit as compared with the variable gain amplifier 200. For that reason, the variable gain amplifier 1200 is capable of reducing the circuit area and current consumption of the voltage correction unit 210_2.

Incidentally, in the examples of FIGS. 12 and 13, there has been descried the case where the single stage of variable gain amplifier circuit is used. However, even in the case where a plurality of stages of variable gain amplifier circuits are used, processing to be carried out by the voltage correction unit 210 located in the last stage (position closest to A/DC 230) can be realized by the control unit 240.

The processing described in the embodiments 1 through 4 can be realized by causing a circuit having an arithmetic function such as a processor to read one or more instructions from at least one tangible and readable medium.

Such a medium takes the form of a magnetic medium (e.g., hard disk), an optical medium (e.g., compact disk (CD), DVD), a volatile memory, a memory of an arbitrary type like a nonvolatile memory, etc., but is not limited to these forms.

The volatile memory may include a DRAM (Dynamic Random Access Memory) and an SRAM (Static Random Access Memory). The nonvolatile memory may include a ROM and an NVRAM. A semiconductor memory may be a part of a semiconductor circuit together with at least one processor.

Although the invention made above by the present inventors has been described specifically on the basis of the embodiments, the present invention is not limited to the embodiments referred to above. It is needless to say that various changes can be made thereto within the scope not departing from the gist thereof.

What is claimed is:

1. A variable gain amplifier comprising:
    a differential amplifier circuit including an inversion input terminal, a non-inversion input terminal, an inversion output terminal, and a non-inversion output terminal;
    first and second feedback resistors respectively coupled between the inversion output terminal and the non-inversion input terminal and between the non-inversion output terminal and the inversion input terminal;
    first and second input resistors respectively coupled to the inversion input terminal and the non-inversion input terminal;
    a control unit for controlling resistance values of the first and second feedback resistors or resistance values of the first and second input resistors to control a gain;
    a first voltage correction unit coupled to a preceding stage of the first and second input resistors and for outputting a first correction voltage to correct a potential difference generated between a first conductor provided with the first input resistor and a second conductor provided with the second input resistor; and
    a second voltage correction unit coupled to the inversion output terminal and the non-inversion output terminal and for correcting a potential difference generated between a third conductor coupled to the inversion output terminal and a fourth conductor coupled to the non-inversion output terminal,
    wherein the control unit is configured to control the first correction voltage and a correction amount of the potential difference by the second voltage correction unit and thereby attenuate a DC offset voltage generated between the inversion output terminal and the non-inversion output terminal,
    wherein the DC offset voltage includes a first offset voltage which depends on the gain, and a second offset voltage which does not depend on the gain,
    wherein the control unit is configured to attenuate the first offset voltage of the DC offset voltage by the first correction voltage, and
    wherein the control unit is configured to attenuate the second offset voltage of the DC offset voltage by the correction amount of the potential difference by the second voltage correction unit.

2. The variable gain amplifier according to claim 1,
    wherein the control unit is configured to set the correction amount of the potential difference by the second voltage correction unit in a state in which the control unit controls the gain in such a manner that the second offset voltage becomes sufficiently larger than the first offset voltage, and
    wherein the control unit is configured to set the first correction voltage in a state in which the control unit controls the gain in such a manner that the first offset voltage becomes sufficiently larger than the second offset voltage.

3. The variable gain amplifier according to claim 2, wherein the control unit is configured to set the first correction voltage after the correction amount of the potential difference by the second voltage correction unit is set.

4. The variable gain amplifier according to claim 1,
    further comprising a short-circuit element arranged in a preceding stage of the first voltage correction unit and for short-circuiting the first conductor and the second conductor,
    wherein the control unit is configured to short-circuit the first conductor and the second conductor by the short-circuit element when at least the first correction voltage is set.

5. The variable gain amplifier according to claim 1, wherein the second voltage correction unit is configured to output a second correction voltage and thereby correct the potential difference generated between the third conductor and the fourth conductor.

6. The variable gain amplifier according to claim 1, wherein the second voltage correction unit includes:
    an A/D converter which converts the potential difference generated between the third conductor and the fourth conductor into a digital signal; and
    a processor which processes the digital signal so as to correct the potential difference generated between the third conductor and the fourth conductor.

7. A method for attenuating a DC offset voltage generated in a variable gain amplifier including a differential amplifier circuit having an inversion input terminal, a non-inversion input terminal, an inversion output terminal, and a non-inversion output terminal; first and second feedback resistors respectively coupled between the inversion output terminal and the non-inversion input terminal and between the non-inversion output terminal and the inversion input terminal; and first and second input resistors respectively coupled to the inversion input terminal and the non-inversion input terminal, comprising:
    controlling resistance values of the first and second feedback resistors or resistance values of the first and second input resistors to control a gain;
    outputting a first correction voltage to correct a potential difference generated between a first conductor provided with the first input resistor and a second conductor provided with the second input resistor; and
    correcting a potential difference generated between a third conductor coupled to the inversion output terminal and a fourth conductor coupled to the non-inversion output terminal,
    wherein the DC offset voltage includes a first offset voltage which depends on the gain, and a second offset voltage which does not depend on the gain, wherein the step of correcting the potential difference includes:

controlling the gain in such a manner that the first offset voltage becomes sufficiently larger than the second offset voltage; and setting a potential difference correction amount for attenuating the second offset voltage of the DC offset voltage, and wherein the outputting the first correction voltage includes:

controlling the gain in such a manner that the first offset voltage becomes sufficiently larger than the second offset voltage in a state in which the second offset voltage is attenuated by the potential difference correcting operation; and setting the first correction voltage so as to attenuate the first offset voltage of the DC offset voltage.

8. A receiving device comprising a variable gain amplifier according to claim 1.

9. A variable gain amplifier comprising:

a differential amplifier circuit including an inversion input terminal, a non-inversion input terminal, an inversion output terminal, and a non-inversion output terminal;

first and second feedback resistors respectively coupled between the inversion output terminal and the non-inversion input terminal and between the non-inversion output terminal and the inversion input terminal;

first and second input resistors respectively coupled to the inversion input terminal and the non-inversion input terminal;

a control unit for controlling resistance values of the first and second feedback resistors or resistance values of the first and second input resistors to control a gain;

a first voltage correction unit coupled to a preceding stage of the first and second input resistors and for outputting a first correction voltage to correct a potential difference generated between a first conductor provided with the first input resistor and a second conductor provided with the second input resistor; and a second voltage correction unit coupled to the inversion output terminal and the non-inversion output terminal and for correcting a potential difference generated between a third conductor coupled to the inversion output terminal and a fourth conductor coupled to the non-inversion output terminal, wherein the control unit is configured to control the first correction voltage and a correction amount of the potential difference by the second voltage correction unit and thereby attenuate a DC offset voltage generated between the inversion output terminal and the non-inversion output terminal, and wherein the second voltage correction unit is directly coupled to the inversion output terminal and the non-inversion output terminal.

* * * * *